United States Patent [19]

Minakami et al.

[11] Patent Number: 5,381,859
[45] Date of Patent: Jan. 17, 1995

[54] HEAT SINK AND THE PRODUCING METHOD THEREOF

[75] Inventors: Ko Minakami, Kawasaki; Toshinori Terashima; Toshio Maeda, both of Yokohama; Tomiya Sasaki, Kawasaki; Katsumi Hisano, Yokohama; Hideo Iwasaki, Kawasaki; Koichiro Kawano, Yokohama, all of Japan

[73] Assignee: Kabushiki kaisha Toshiba, Kawasaki, Japan

[21] Appl. No.: 72,220

[22] Filed: Jun. 7, 1993

Related U.S. Application Data

[63] Continuation of Ser. No. 788,435, Nov. 6, 1991, abandoned.

[30] Foreign Application Priority Data

Nov. 9, 1990 [JP] Japan ................................ 2-302730
Aug. 9, 1991 [JP] Japan ................................ 3-200859

[51] Int. Cl.6 ............................................. F28F 7/00
[52] U.S. Cl. ................................... 165/80.3; 165/185; 174/16.3; 257/721; 257/722; 361/692; 361/703
[58] Field of Search ............... 165/164, 182, 185, 80.3; 257/721, 722; 361/692, 690, 702, 703; 174/16.3

[56] References Cited

U.S. PATENT DOCUMENTS

| 2,737,370 | 3/1956 | Frisch et al. | 165/182 |
|---|---|---|---|
| 2,775,431 | 12/1956 | Krassowski | 165/182 |
| 2,947,152 | 8/1960 | Bloem | 165/185 |
| 3,411,041 | 11/1968 | Block | 361/688 |
| 3,477,504 | 11/1969 | Colyer et al. | 165/164 |
| 3,534,813 | 10/1970 | Fleming | 165/164 |
| 4,143,710 | 3/1979 | La Porte et al. | 165/182 |
| 4,147,210 | 4/1979 | Pronko et al. | 165/164 |
| 4,762,172 | 8/1988 | Grehier et al. | 165/165 |
| 4,860,822 | 8/1989 | Sacks | 165/182 |
| 4,868,712 | 9/1989 | Woodman | 361/388 |
| 5,058,665 | 10/1991 | Harada | 165/164 |
| 5,180,001 | 1/1993 | Okada et al. | 165/80.4 |

FOREIGN PATENT DOCUMENTS

| 54921 | 4/1951 | France | 165/185 |
|---|---|---|---|
| 2851125 | 6/1979 | Germany | 165/164 |
| 3330385 | 3/1984 | Germany . | |
| 27679 | 2/1980 | Japan | 165/185 |
| 188855 | 11/1982 | Japan | 165/185 |
| 213691 | 9/1987 | Japan . | |
| 101033 | 5/1988 | Japan | 29/890.039 |
| 153095 | 7/1949 | Sweden | 165/164 |
| 2167905 | 6/1986 | United Kingdom | 165/185 |
| WO-A-8900751 | 1/1989 | WIPO . | |

Primary Examiner—John Rivell
Assistant Examiner—L. R. Leo
Attorney, Agent, or Firm—Oblon, Spivak, McClelland, Maier & Neustadt

[57] ABSTRACT

A heat sink according to the invention comprises a multilayered body prepared by laying one upon the other a plurality of heat sink fin elements having pin-fin sections formed by cutting a number of slits through thin plates of a thermally conductive material with spacers, each being inserted between two adjacent heat sink fin elements to separate them by a given distance. The method of preparing a heat sink comprises steps of preparing heat sink fin elements by forming a number of slits and a surrounding marginal frame area in each of a first set of thermally conductive thin plates, preparing spacers by cutting out a central area of and forming a surrounding marginal frame area in each of a second set of thermally conductive thin plates having a shape same as that of the first set of thin plates, laying said heat sink fin elements and said spacers alternately one upon the other and bonding said assembled heat sink fin elements and spacers together at the outer surface or contacted areas to form a multilayered body.

23 Claims, 29 Drawing Sheets

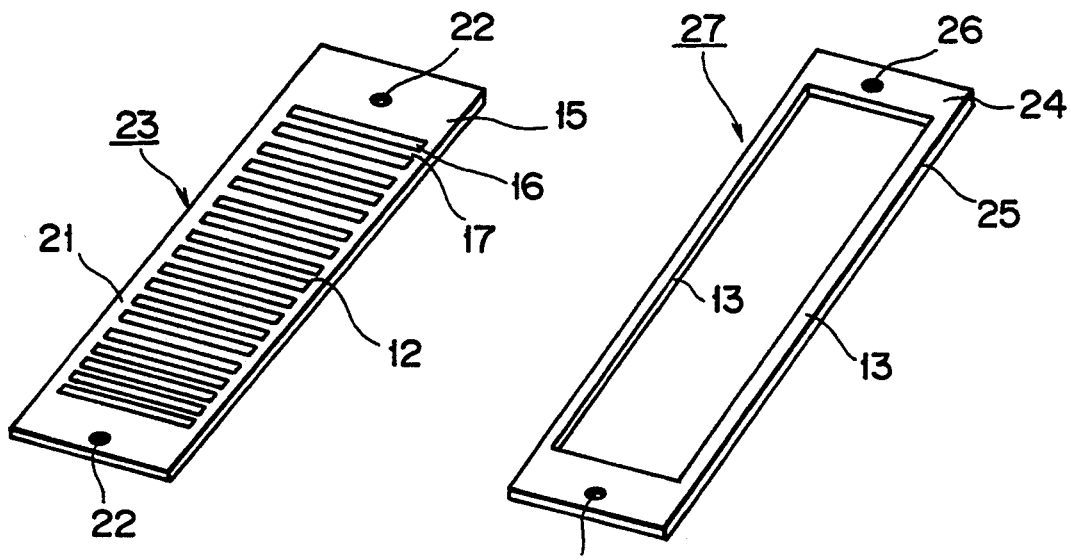
FIG. 4A
FIG. 4B
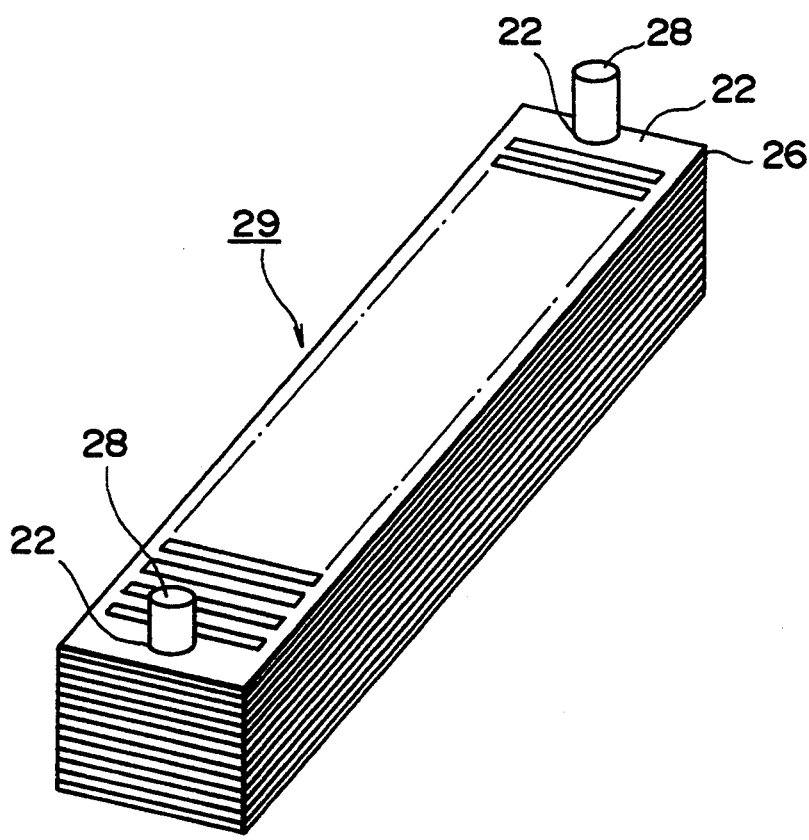
FIG. 4C

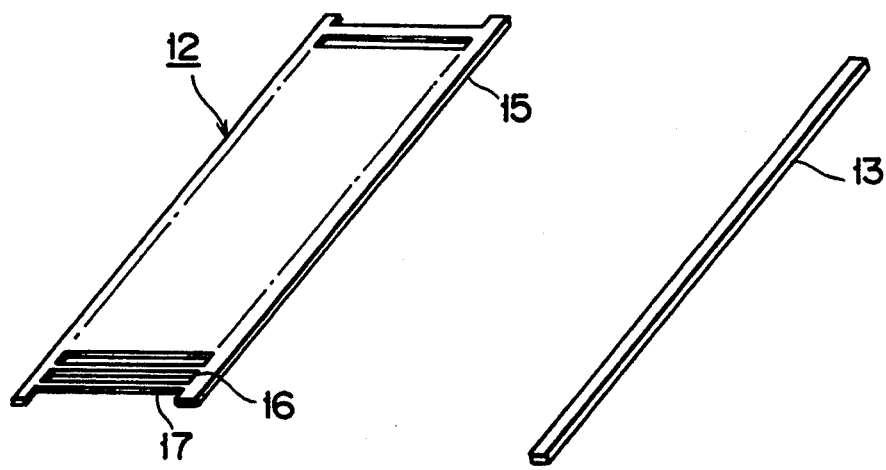
F I G. 6A    F I G. 6B
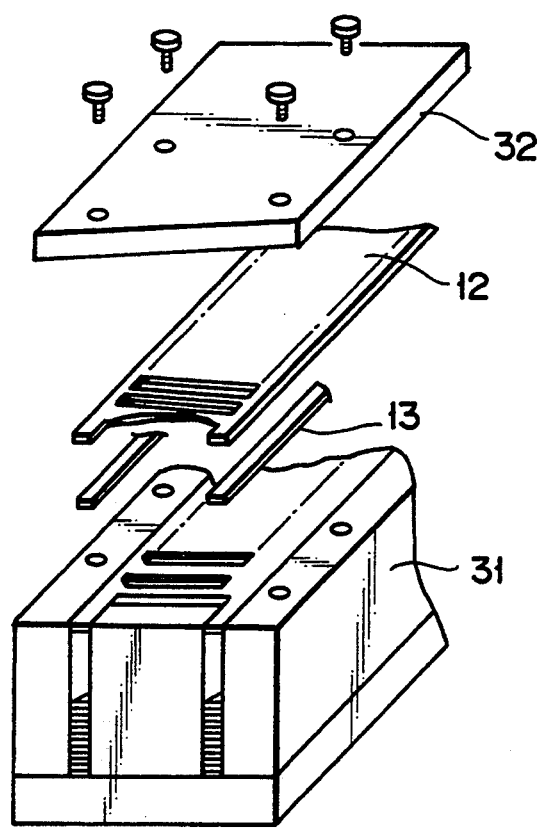
F I G. 6C

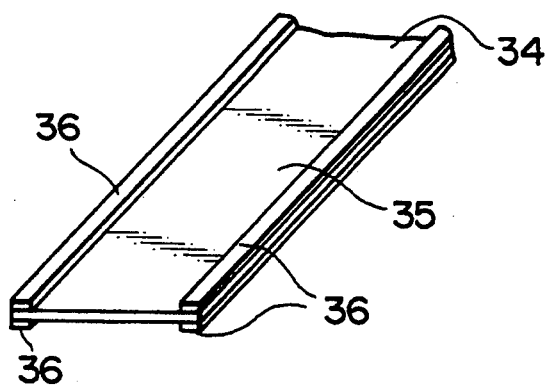
F I G. 8A
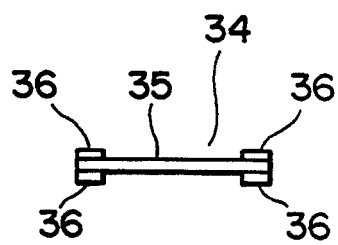
F I G. 8B
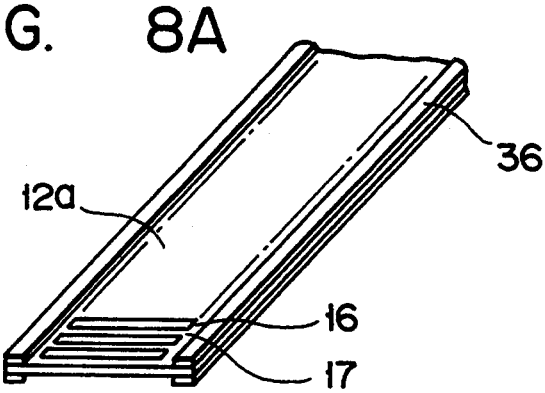
F I G. 8C
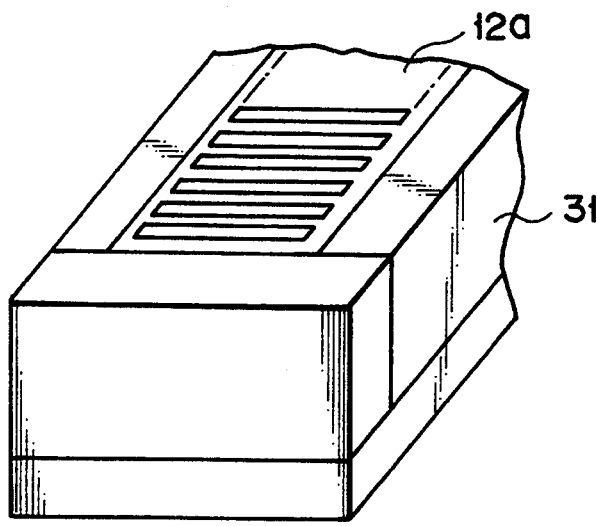
F I G. 8D
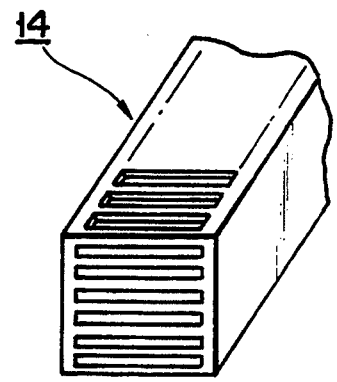
F I G. 8E

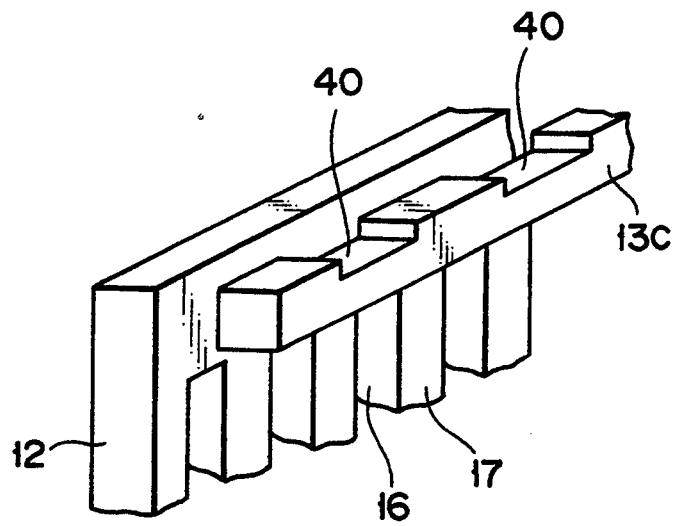
F I G. 13
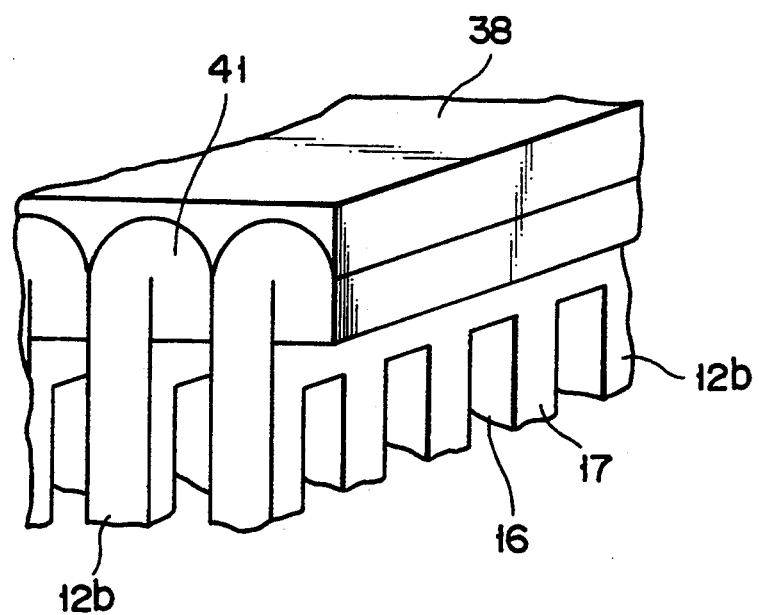
F I G. 14

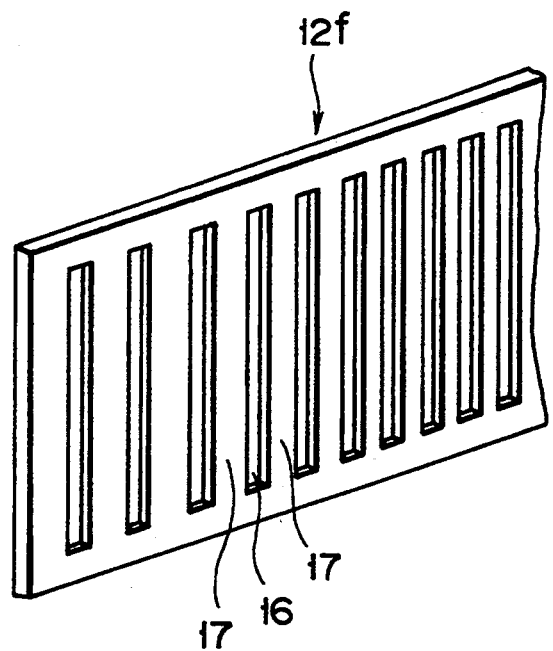
F I G. 19
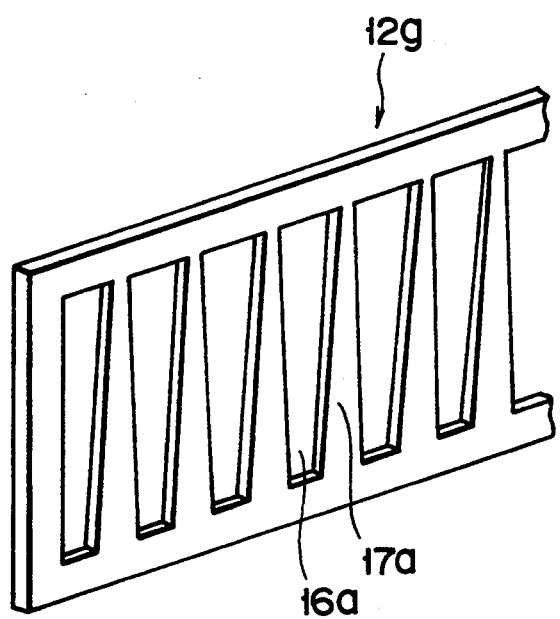
F I G. 20

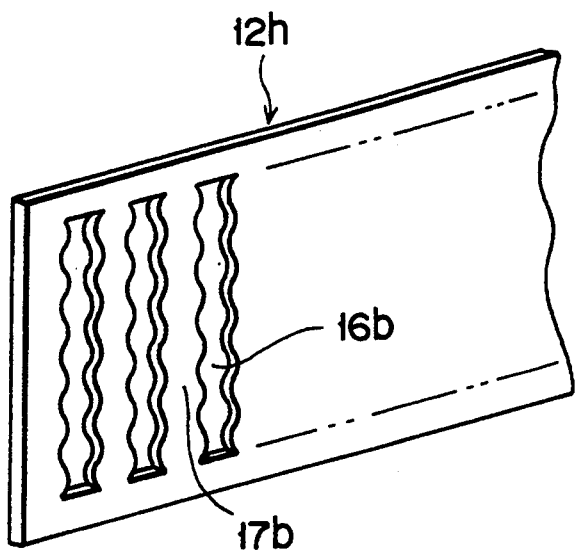
F I G. 21
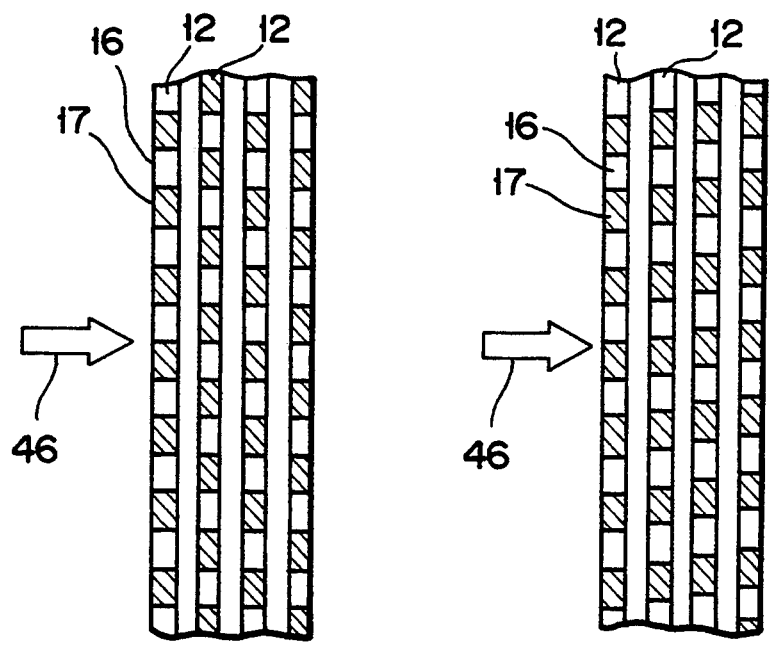
F I G. 22A    F I G. 22B

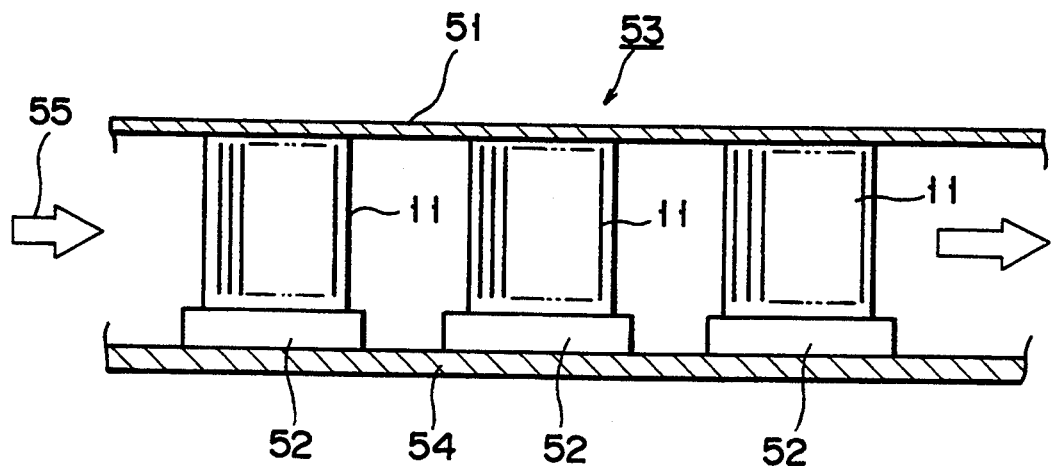
F I G. 25
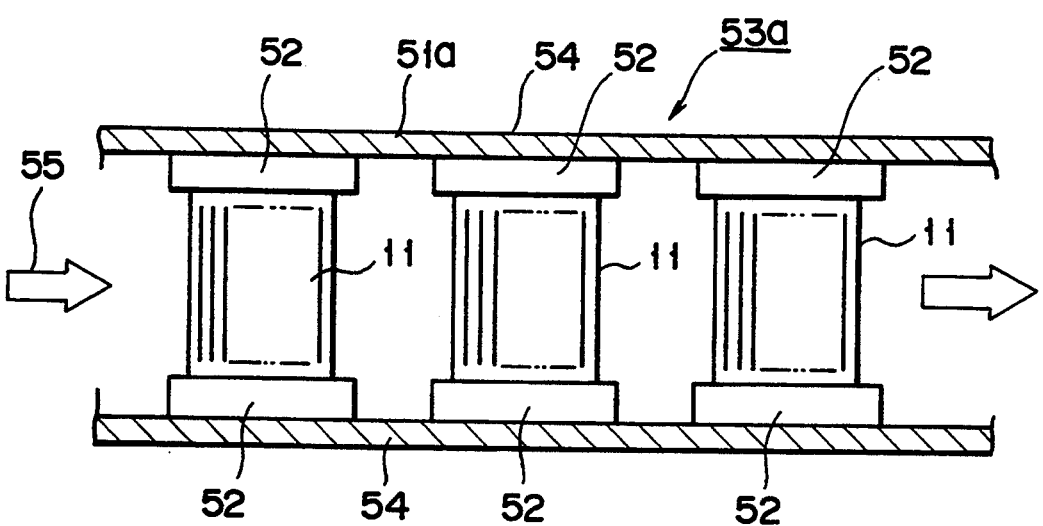
F I G. 26

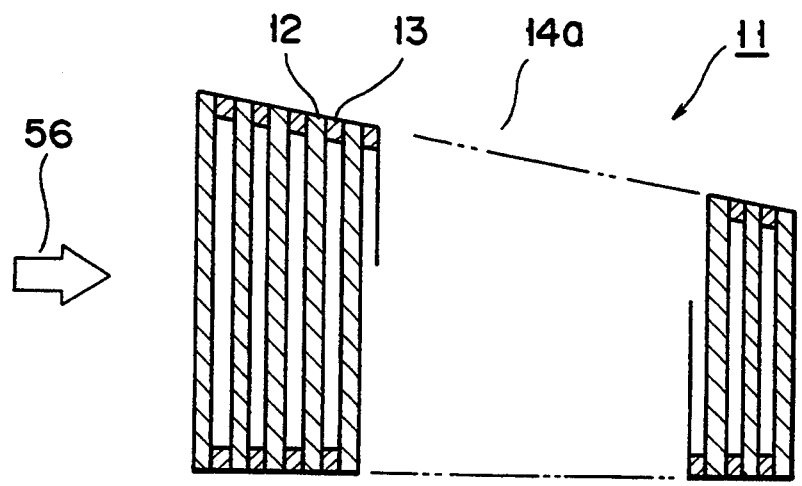
F I G. 27
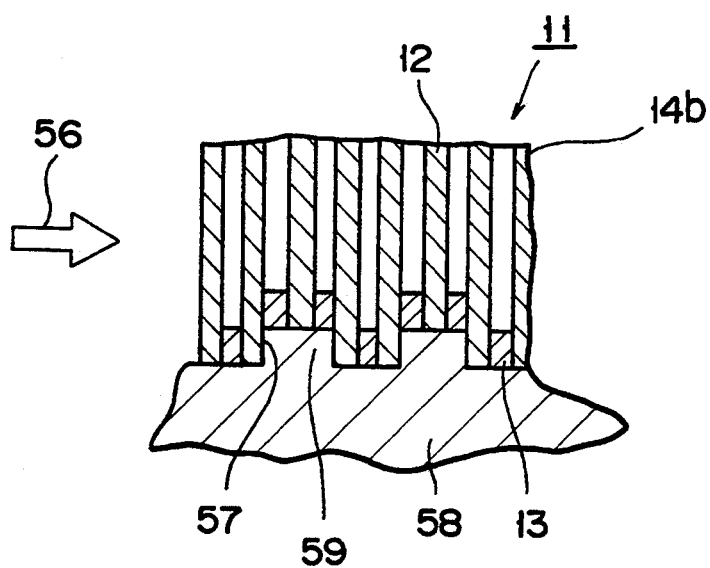
F I G. 28

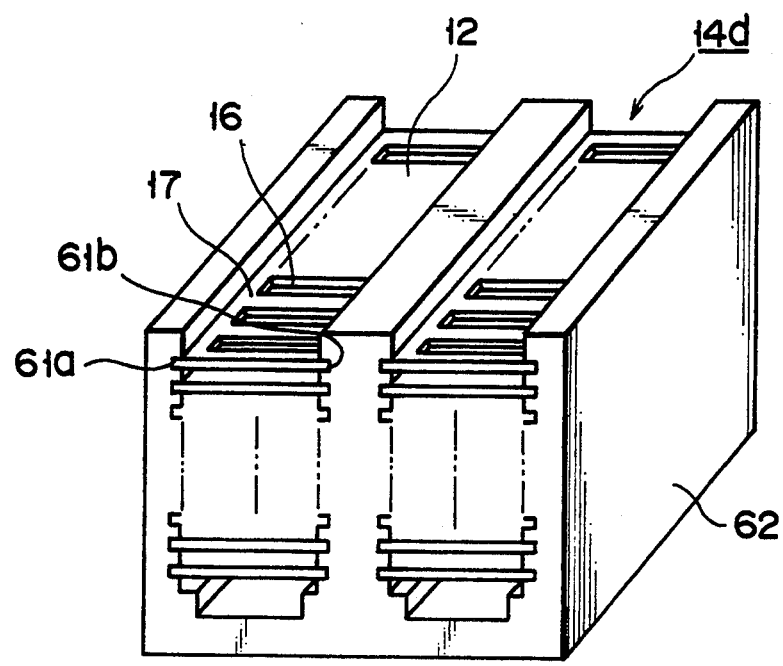
F I G. 30
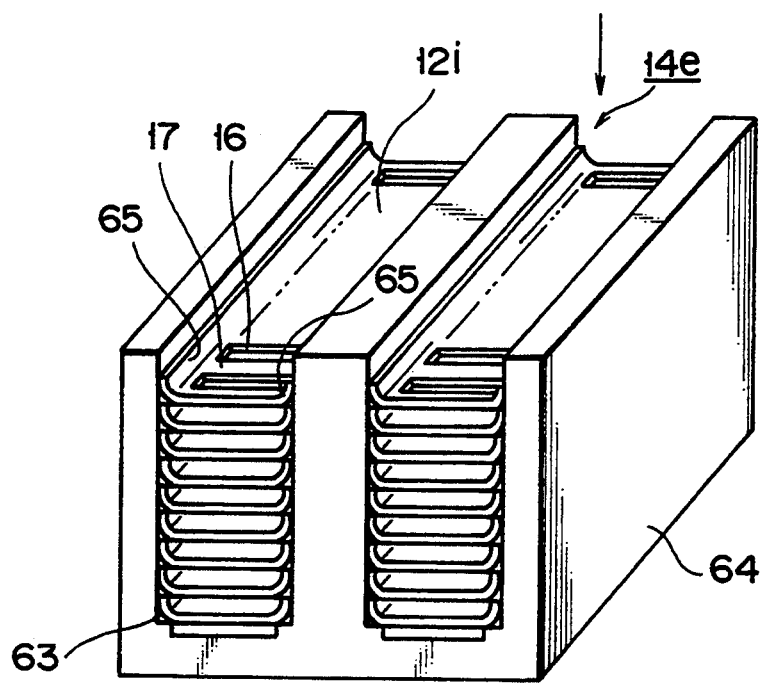
F I G. 31

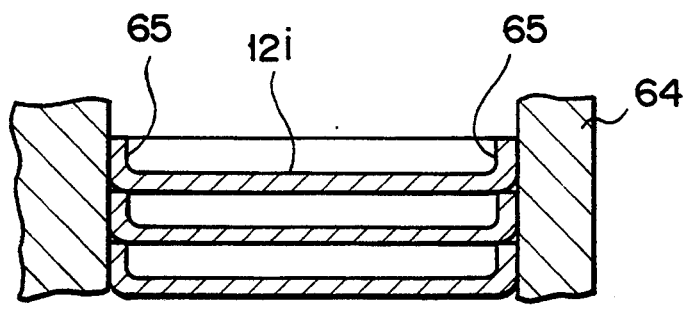
F I G. 32

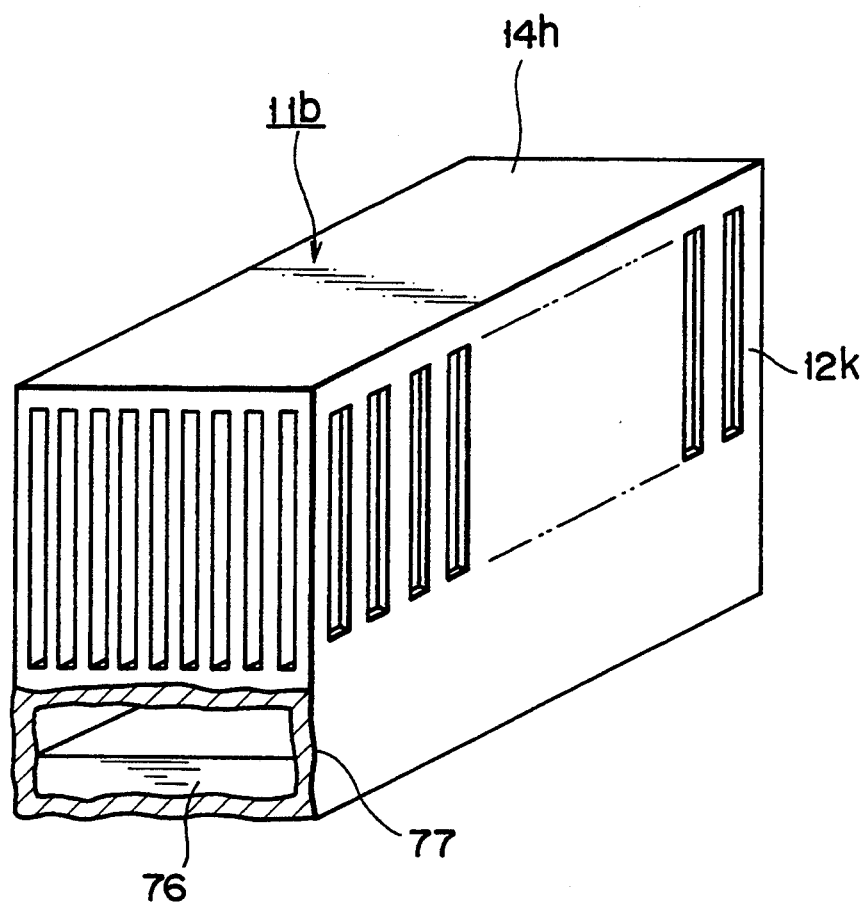
F I G. 36

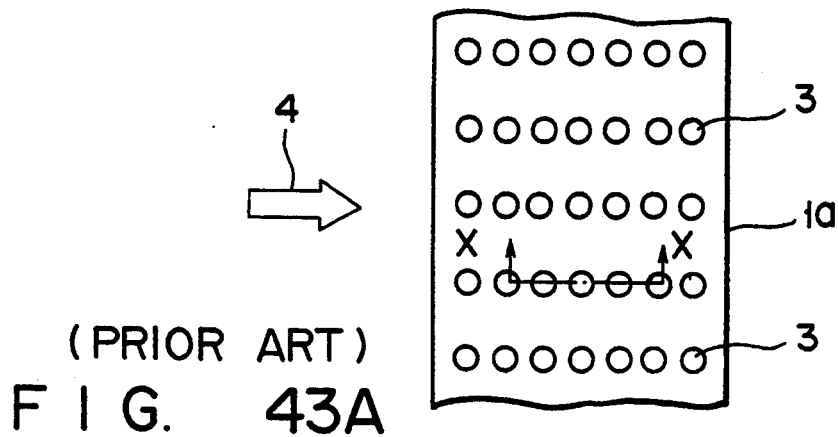
(PRIOR ART) FIG. 43A
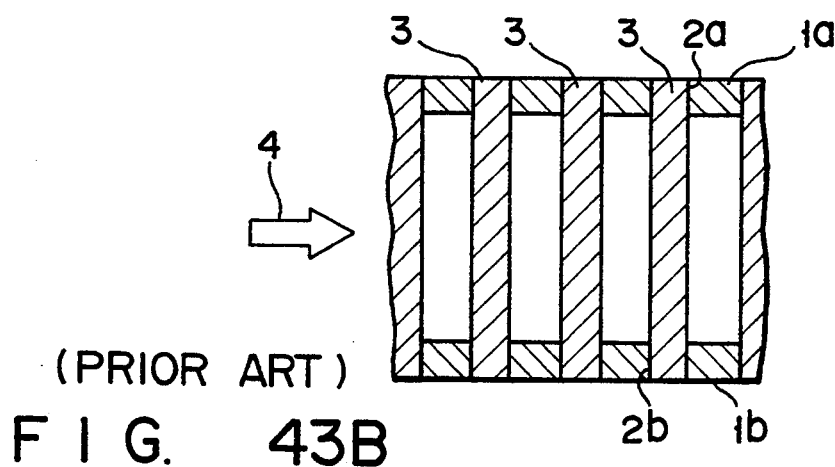
(PRIOR ART) FIG. 43B
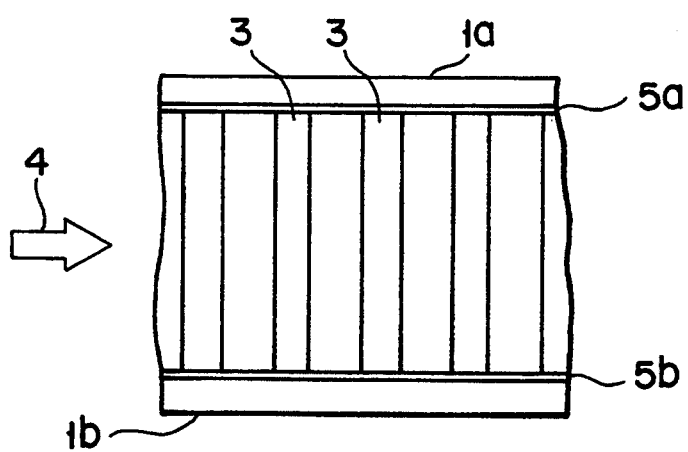
(PRIOR ART) FIG. 44

HEAT SINK AND THE PRODUCING METHOD THEREOF

This application is a continuation of application Ser. No. 07/788,435, filed on Nov. 6, 1991, now abandoned.

BACKGROUND OF THE INVENTION

1. Field of the Invention

This invention relates to a heat sink to be suitably used for applications including an apparatus for cooling integrated circuit packages, a radiating apparatus and a heat exchanger as well as to the method of producing thereof.

2. Description of the Related Art

A "pin-fin type heat sink" has so small characteristics length that the coefficient of the thermal conductivity is high, and radiate several times more heat than a "plate-fin type heat sink" having a same area of heat transfer.

A known pin-fin type heat sink normally comprises a pair of heat conductor plates 1a, 1b arranged in parallel with each other and having a plurality of paired and oppositely arranged holes 2a, 2b as typically illustrated in FIGS. 43A and 43B. A fine metal wire 3 is arranged through each pair of holes 2a, 2b and bonded at its both extremities to the inner surface of the respective holes 2a, 2b. Either one or both of the heat conductor plates 1a, 1b is in contact with a heat source or a heat transmission medium and a fluid heat exchanger or coolant (e.g., air, water, etc.) is made to flow between the two heat conductor plates 1a, 1b in a direction indicated by arrow 4 so that heat may be received by the fluid by way of the surface of the fine metal wires 3.

The fine metal wires 3 of a "pin-fin type heat sink" preferably have a very small outer diameter of less than 1 mm to maximize the coefficient of the thermal conductivity, while as many as possible fine metal wires 3 should be used in it in order to optimize the heat transfer characteristics of the heat sink. Therefore, preparation of a known pin-fin type heat sink having a configuration as described above requires a large number of processing steps including those of "boring holes" through heat conductor plates 1a, 1b and "fitting and bonding" fine metal wires 3 to the holes and consequently such a method of preparing a pin-fin type heat sink involves a high manufacturing cost.

In an attempt to bypass this problem, there has been proposed a pin-fin type heat sink that does not require a step of boring holes through heat conductor plates 1a, 1b and can be produced by simply bonding the ends of fine metal wires 3 to the inner surfaces of the heat conductor plates 1a, 1b by way of bond layers 5a, 5b of solder or silver, which are fused or brazed appropriately for bonding. While such a pin-fin type heat sink is free from the step of boring holes through heat conductor plates and therefore may be produced at a reduced cost, each fine metal wire 3 should be exactly, though temporarily, positioned on the inner surfaces of the heat conductor plates 1a, 1b when it is bonded thereto, making the pattern of arrangement of fine metal wires 3 and the distance between two adjacent wires subject to inconvenient limitations.

Besides, in areas, if any, where the fine metal wires 3 do not contact the heat conductor plates 1a, 1b, heat is conveyed from the latter to the former by way of the bond layers 5a, 5b to give rise to a very large thermal resistance or a large resistance against heat conduction in these areas.

As described above, a known heat sink having a "pin-fin type structure" not only involves rather complicated manufacturing steps and high manufacturing cost but also is subject to various limitations concerning the distance between adjacent fins and the pattern of fin arrangement, not to mention the problem of large thermal resistance.

SUMMARY OF THE INVENTION

In view of the above problems, it is therefore the object of the present invention to provide a heat sink that does not require complicated manufacturing steps, is not subject to limitations in terms of the size and shape and the pitch and pattern of arrangement of pins and has a high "heat transfer efficiency" as well as to provide the production method thereof.

According to the invention, the above object is achieved by providing a heat sink comprising as its principal component a multilayered body formed by arranging a plurality of thin heat sink fin elements, each being realized by forming a number of slits through a thermally conductive plate, to a multilayer structure with spacer means, each being inserted between two adjacent elements for separating them by a given distance.

A radiating apparatus realized by using a heat sink according to the invention typically comprises a ventilation duct and multilayered bodies arranged within said ventilation duct in such a manner that they are kept under a condition where they are in contact with a heat source and allow cooling fluid to flow at any appropriate rate within the ventilation duct, each of said multilayered bodies being realized by arranging a plurality of thin heat sink fin elements to a multilayer structure with spacer means, each being inserted between two adjacent fin elements for separating them by a given distance, each of said heat sink fin elements being realized by forming a number of slits through a thermally conductive plate.

The method of producing a heat sink according to the invention comprises steps of preparing thin heat sink fin elements by forming a number of slits in each of a plurality of thermally conductive plates, laying said plurality of heat sink fin elements one upon the other with a spacer element inserted between any two adjacent fin elements and bonding said heat sink fin elements and said spacer elements together to form a multilayered body.

As may be apparent from the above description, the heat sink fin elements of the multilayered body of a heat sink according to the invention constitute a vital and principal component and can be prepared to any desired pattern and dimensions by means of a punching technique or an etching technique. Therefore, the producing method of such a heat sink according to the invention is very simple and applied to produce heat sink fin elements that meet any specifications in terms of the width, number, space, shape and distribution of fins. Consequently, the producing method of such a heat sink according to the invention may be effectively used to offer pin-fin type heat sinks of a desired configuration at low cost.

Since the steps of preparing thin heat sink fin elements by forming a number of slits in each of a plurality of thermally conductive plates, laying said plurality of heat sink fin elements one upon the other with a spacer element inserted between any two adjacent fin elements and bonding said heat sink fin elements and said spacer elements together to form a multilayered body in the method of producing a heat sink according to the invention are free from technical problems, it can significantly contribute to reduction of the cost of manufacturing pin-fin type radiators.

Now the present invention will be described in greater detail by referring to the accompanying drawings that illustrate preferred embodiments of the invention.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 4A through 4C are perspective views showing different assembly stages of a preferred mode of implementation of the producing method of a heat sink of the invention.

FIGS. 6A through 6C are perspective and exploded views showing different assembly stages of still another preferred mode of implementation of the producing method of a heat sink of the invention.

FIGS. 8A through 8E are perspective and side views showing different assembly stages of still another preferred mode of implementation of the producing method of a heat sink of the invention.

FIG. 13 is a perspective partial view of still another modified multilayered body of the embodiment of FIG. 1.

FIG. 14 is a perspective partial view of still another modified multilayered body of the embodiment of FIG. 1.

FIG. 19 is an exploded perspective view of still another modified heat sink fin elements of the embodiment of FIG. 1.

FIG. 20 is an exploded perspective view of still another modified heat sink fin elements of the embodiment of FIG. 1.

FIG. 21 is an exploded perspective view of still another modified heat sink fin elements of the embodiment of FIG. 1.

FIGS. 22A and 22B are sectional views showing two different arrangement of heat sink fin elements of the embodiment of FIG. 1.

FIG. 25 is a sectional view of a radiating apparatus comprising heat sinks according to the invention.

FIG. 26 is a sectional view of another radiating apparatus comprising heat sinks according to the invention.

FIG. 27 is a sectional view of still another modified multilayered body of the embodiment of FIG. 1.

FIG. 28 is a sectional view of still another modified multilayered body of the embodiment of FIG. 1.

FIG. 30 is a perspective view of still another modified multilayered body of the embodiment of FIG. 1.

FIG. 31 is a perspective view of still another modified multilayered body of the embodiment of FIG. 1.

FIG. 32 is a partial sectional view of the multilayered body of FIG. 31.

FIG. 36 is a partially broken perspective view of still another embodiment of the heat sink of the invention.

FIG. 43A is a plan view of a conventional heat sink.

FIG. 43B is a sectional view of the heat sink of FIG. 43A cut along X—X line, and FIG. 44 is a side view of another conventional heat sink schematically illustrating its configuration.

DETAILED DESCRIPTION OF THE PREFERRED EMBODIMENTS

In FIG. 1 showing a preferred embodiment of the heat sink of the invention, the heat sink 11 comprises a multilayered body 14 realized by laying a plurality of heat sink fin elements 12 one upon the other to a multilayer structure with a spacer 13 inserted between any two adjacent elements 12.

Figure 3:
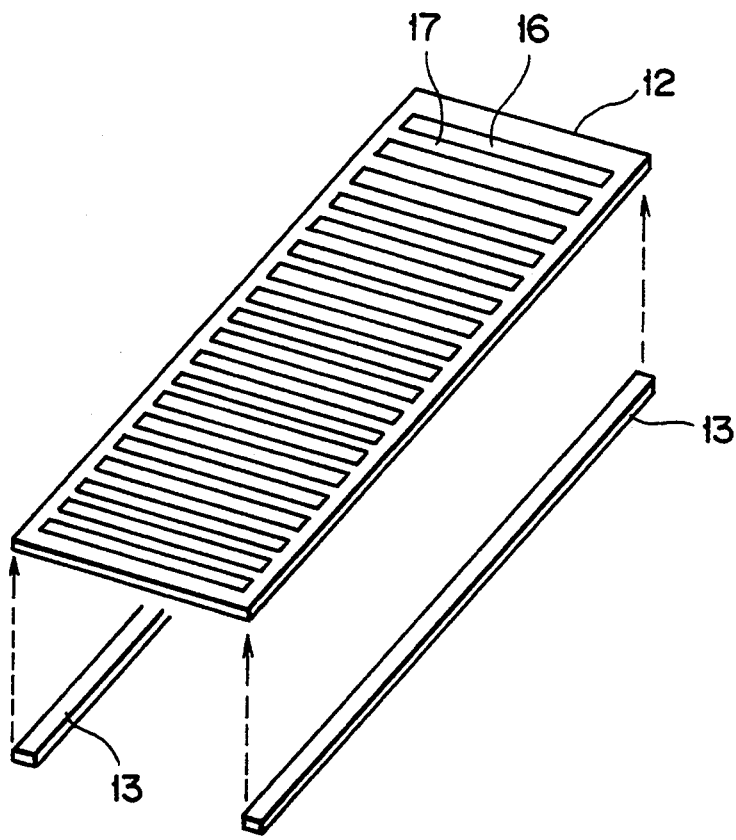
FIG. 3 is an exploded view of a heat sink fin element and a pair of spacers to be used for a heat sink.

Each of the heat sink fin elements 12 is made of an rectangular thin plate 15 of a thermally conductive material such as copper or aluminum having a number of slits 16 arranged in said thin plate 15 in parallel with its shorter edges and pin-fin sections 17 formed by the remaining areas of the thin plate 15 as shown in FIG. 3.

While the thickness of the thin plate 15 is determined depending on the actual application of the heat sink realized by using such thin plates, it may be approximately 0.2 mm thick if the heat sink 11 comprising it is used for the purpose of heat emission of an integrated circuit package. The width of each of the slits 16 is typically between 0.1 and 0.01 mm, while that of each of the pin fin sections 17 is typically 0.2 mm. A heat sink having dimensions as described above may appear as illustrated in FIG. 1B. The slits 16 can be formed by means of a punching or etching technique.

On the other hand, the spacers 13 are made of a material similar to that of the thin plates 15 and normally have a thickness of 0.1 to 1.0 mm. Each of the spacers 13 is arranged along and between a pair of juxtaposed longer edges of two adjacent heat sink fin elements 12 (edges running in parallel with their slits) in such a manner it does not constitute an obstacle that, if partly, blocks any of the slits 16 as illustrated in FIG. 3. (When the pin-fin sections 17 are long and the number of slits of a heat sink fin element is small, the longer and shorter edges of the heat sink fin elements may be defined conversely.)

Figure 2A:
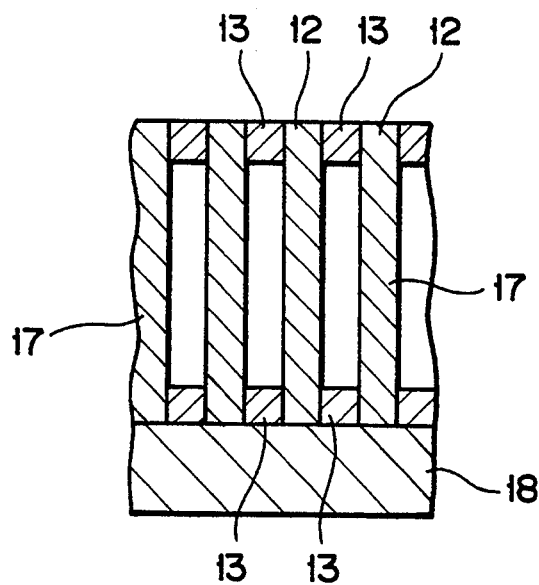
FIG. 2A is a sectional view of the embodiment of FIG. 1A cut along A—A line.
Figure 2B:
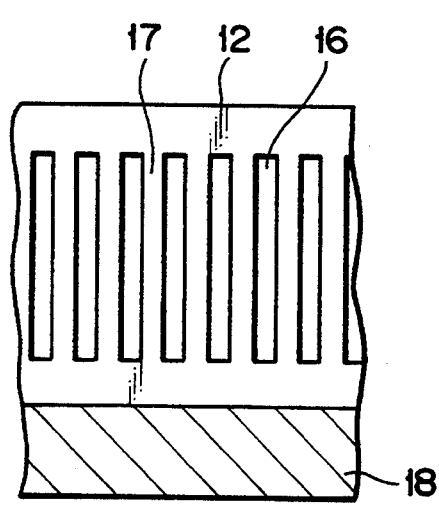
FIG. 2B is a sectional view of the embodiment of FIG. 1A cut along B—B line.
Figure 2C:
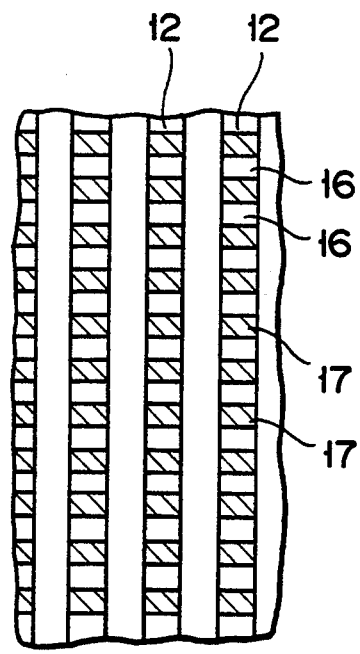
FIG. 2C is a sectional view of the embodiment of FIG. 1A cut along C—C line.

Therefore, a characteristic feature of a heat sink according to the invention is that the spacers 13 are arranged along the edges of the heat sink fin elements 12 and in parallel with the slits 16. The spacers 13 and the heat sink fin elements 12 are bonded together with solder or other appropriate bonding agent to produce a multilayered body 14 having a shape of rectangular block. Therefore, such a multilayered body 14 has an inside structure as shown in FIGS. 2A through 2C, where a number of gaps are produced by slits 16 and spacers 13.

A heat sink 11 having a configuration as described above is then rigidly fitted to a thermally conductive plate 18 which is in contact with a heat transmission medium (e.g., water) or loaded with a heat source by soldering or other bonding technique in such a way that an outer surface of the multilayered body 14 where the spacers 13 are fully exposed faces the thermally conductive plate 18. When the heat sink 11 is used for an LSI package, its multilayered body 14 may be directly placed on a surface of the LSI package without using a thermally conductive plate 18 in order to reduce the overall thermal resistance and enhance the cooling efficiency of the heat sink 11. Similarly, the heat sink 11 may be directly fitted to a heat source to enhance its cooling efficiency. The multilayered body 14 may be arranged in an atmosphere of a flowing fluid coolant that runs in a direction as indicated by large arrow 19 of a solid line or arrow 20 of a doubly dotted chain line in FIG. 19. With such an arrangement, the fluid coolant closely contacts with the pin-fin sections 17 of each of the heat sink fin elements 12 as it flows through the multilayered body 14 so that the heat conveyed from the thermally conductive plate 18 to the heat sink fin elements 12 may be quickly transferred to the fluid coolant by way of the pin-fin sections 17 to enhance the heat radiating performance of the heat sink. It should be noted that the direction of flow of fluid coolant is not limited to those indicated in FIG. 19 and the coolant may flow obliquely or may be blown into the multilayered body from upward if it is not covered by a top plate.

Again, a heat sink 11 according to the invention comprises as its principal component a multilayered body 14 formed by arranging a plurality of thin heat sink fin elements 12, each being realized by forming a number of slits 16 through a thermally conductive plate, to a multilayer structure with spacers 13, each being inserted between two adjacent elements for separating them by a given distance. The heat sink fin elements 12 of a multilayered body 14 are prepared by means of a "punching" or "etching" technique so that heat sink fin elements of any pattern and dimensions may be obtained. Therefore, the producing method of such a heat sink according to the invention is very simple and applied to produce heat sink fin elements 12 that meet any specifications in terms of the width, number, space, shape and distribution of fins. Consequently, the producing method of such a heat sink according to the invention may be effectively used to offer pin-fin type heat sinks of a desired configuration at low cost. Besides, a heat sink 11 according to the invention and having a configuration as described above is characterized in that its top or bottom surface area may be regarded as a single plate member and can be used as a thermally conductive plate as it is constituted by a number of heat sink fin elements 12 and spacers 13 which are tightly and alternately arranged without leaving any gaps there. Therefore, a heat sink 11 according to the invention can be bonded directly to an LSI package for effective heat transfer and cooling.

Now, the producing method of a heat sink according to the invention will be described.

FIGS. 4A through 4C show perspective views of different assembly stages of a preferred mode of the producing method of a heat sink of the invention.

Firstly in step (1), a number of slits 16 are formed through a rectangular thin plate 15 of a thermally conductive material such as copper or aluminum in parallel with its shorter edges as illustrated in FIG. 4A by means of, for instance, an etching technique. The slits 16 are cut in such a manner that pin-fin sections 17 having a desired width and a marginal zone 21 free of slits are simultaneously formed from the remaining areas of the thin plate 15. A pair of oppositely arranged alignment holes 22 are pierced through the marginal zone at positions close to the shorter edges of the thin plate 15. The processed thin plate 15 will be a part 23 to be used for a heat sink fin element 12.

On the other hand in step (2), a central area of a thin plate 24 of a material same as that of the thin plate 15 having same outer dimensions as those of the thin plate 15 is cut and removed by means of a punching technique to produce a frame body 25 having a shape that corresponds to that of the marginal zone 21 of the thin plate 15 as illustrated in FIG. 4B. A pair of oppositely arranged alignment holes 26 are also bored through the frame body at positions close to the shorter edges of the thin plate 24. The processed thin plate 24 will then be a part 27 to be used for a spacer 13.

Then in step (3), a number of parts 23 and parts 27 prepared in this manner are alternately arranged to form a multilayer structure with a pair of pins 28 inserted through the alignment holes 22, 26 as illustrated in FIG. 4C.

Subsequently in step (4), the parts 23 and 27 of the block-like multilayer structure 29 are bonded together at the outer peripheral areas. The bonding operation may be carried out without difficulty by means of an appropriate technique selected from compression bonding, diffusion bonding, soldering and silver brazing or by using an appropriate bonding agent. Alternatively, the parts 23 and 27 of the block-like multilayer structure 29 may be bonded together by scanning its outer periphery with a laser or electron beam to fuse them for bonding.

Figure 5:
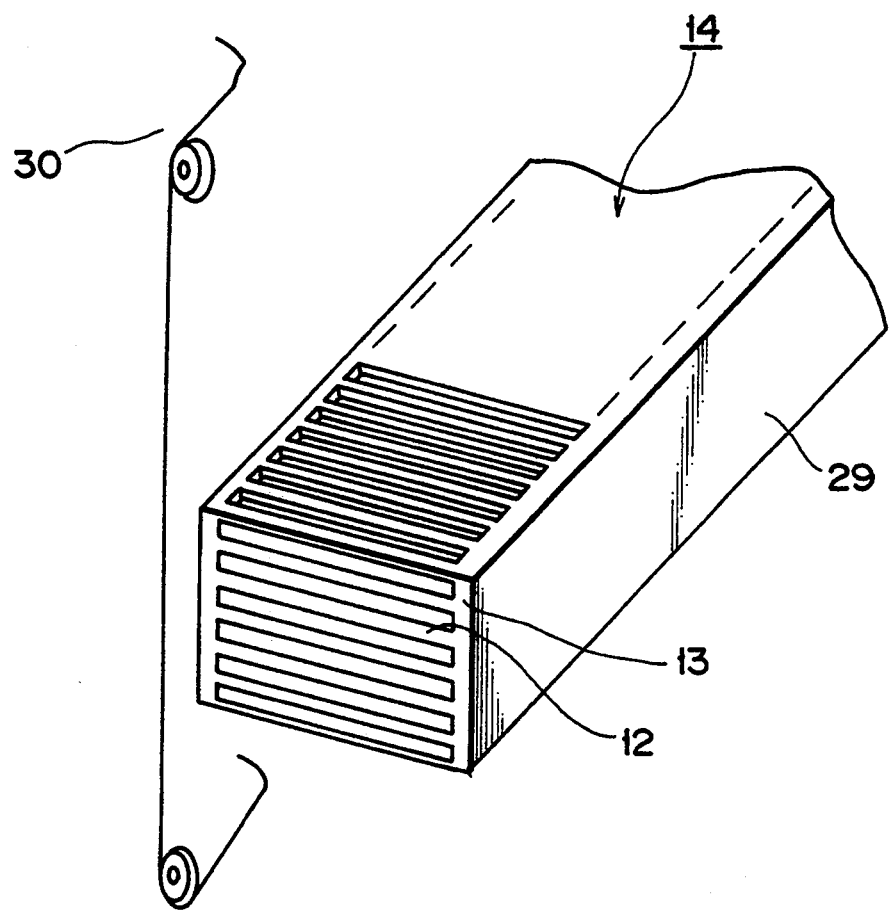
FIG. 5 is a perspective view showing another preferred mode of implementation of the producing method of a heat sink of the invention.
Figure 7:
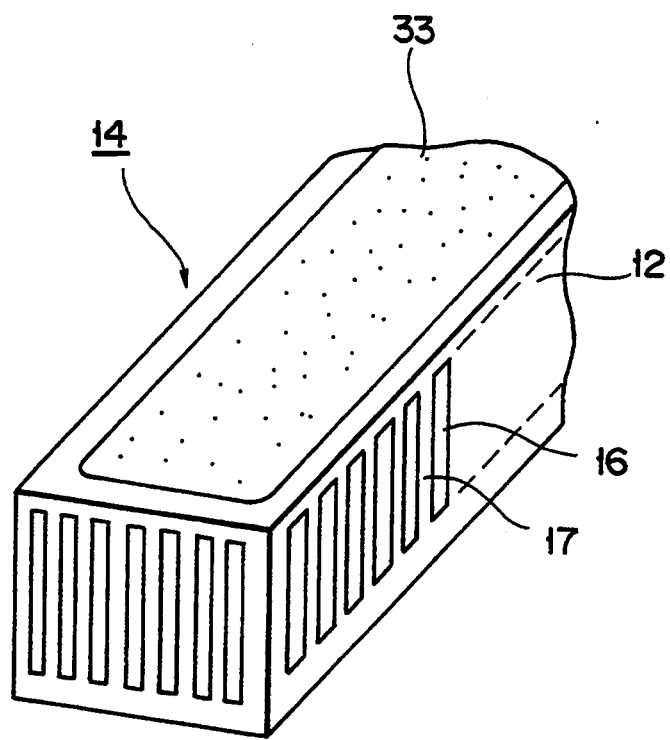
FIG. 7 is a perspective view showing still another preferred mode of implementation of the producing method of a heat sink of the invention.

Finally in step (5), the opposite lateral portions of the block-like multilayer structure 29 that have been used for alignment are cut off and trimmed by means of, for instance, a wire discharge cutter/trimmer 30 as schematically shown in FIG. 5.

A heat sink produced by the above described method comprises a number of heat sink fin elements 12 having pin fin sections 17 and a marginal zone 21 which are integrally formed from a thin plate 15 and therefore it shows only a very low thermal resistance. Moreover, since the marginal zone 21 is firmly bonded with adjacent spacers 13, they function as a single thin plate and effectively convey heat. Thus, such a heat sink can be directly fitted to a heat emitting body (e.g., an LSI package). The contact thermal resistance between the heat emitting body and the heat sink can be minimized by abrading and polishing the surface of the heat sink that come to contact with the heat emitting body.

FIGS. 6A through 6C illustrate an alternative mode of implementation of the producing method of a heat sink according to the invention.

Firstly in step (1) as shown in FIG. 6A, a number of slits 16 are formed through a rectangular thin plate 15 of a thermally conductive material such as copper or aluminum in parallel with its shorter edges by means of, for instance, an etching technique. The slits 16 are cut in such a manner that pin-fin sections 17 having a desired width are simultaneously formed from the remaining areas of the thin plate 15 to produce a heat sink fin element 12. No alignment holes 22 are pierced through the thin plate 15 in this mode of implementation.

On the other hand in step (2), ribbon-shaped spacers 13 are prepared as illustrated in FIG. 6B. Note that a spacer 13 having a marginal zone as in the case of the preceding mode is not formed. The ribbon-shaped spacers 13 are made of solder or silver that can be easily fused or brazed later for bonding under technical considerations. This provides the most characteristic feature of this mode of implementation.

Then in step (3) as shown in FIG. 6C, a number of heat sink fin elements 12 and ribbon-shaped spacers 13 to be used for soldering are alternately arranged in an alignment jig 31. (Note that a heat sink fin element 12 and a pair of ribbon-shaped spacers 13 arranged along opposite edges of the heat sink fin element 12 constitute a unit layer.)

Subsequently in step (4), the jig containing heat sink fin elements 12 and spacers 13 is covered by a lid 32 and subjected to a heat treatment in a furnace (not shown) to bond the heat sink fin elements 12 together by the spacers 13 with a given distance provided between any two adjacent heat sink fin elements A mode of implementation as described above produces a heat sink comprising a multilayered body 14 formed by a number of heat sink fin elements 12 which are bonded together by solder sections 33. It may suffice for the solder sections to have a thickness of only several $\mu m$. If neighboring heat sink fin elements do not show a sufficient gap that separates them from each other, the heat sink fin elements may be displaced relative to each other to avoid any reduction of radiating efficiency or, alternatively heat sink fin elements having different configurations may be stacked as described later.

The ribbon-shaped solder spacers 13 may be replaced by ribbon-shaped spacers 13 made of a thermally conductive material as in the case of the first mode of implementation. If such is the case, the heat sink fin elements and spacers may be aligned by holding them by an alignment jig 31 at lateral edges that are not used for bonding and bonding the heat sink fin elements and the spacers together at the free edges.

Any of the bonding techniques similar to those of the first mode of implementation may be used for the purpose of this mode of implementation. Soldering, silver brazing, or fusion bonding by means of an electronic or laser beam may be appropriate particularly when the heat sink fin elements are bonded together at lateral edges.

FIGS. 8A through 8E illustrate still another preferred mode of implementation of the producing method of a heat sink according to the invention.

The most characteristic feature of this mode of implementation is that it utilizes solder copper clad plates 34 as shown in FIGS. 8A and 8B. A solder copper clad plate 34 comprises solder ribbons 36 arranged along the lateral edges of a thin copper plate 35. While a double side solder copper clad plate carrying solder ribbons 36 on both sides are shown in FIGS. 8A and 8B, a single side solder copper clad plate may also be used for the purpose of the present mode of implementation. The solder ribbons may be replaced by silver ribbons.

Firstly in step (1) as shown in FIG. 8C, a number of slits 16 are formed through a rectangular solder copper clad plate 15 as in the case of preceding modes of implementation. The slits 16 are cut in such a manner that pin-fin sections 17 are simultaneously formed from the remaining areas of the plate 15 to produce a heat sink fin element 12a.

Then in step (2) as shown in FIG. 8D, a number of heat sink fin elements 12a are arranged in an alignment jig 31 to form so many layers. Thereafter in step (3), the solder ribbons 36 are fused in a heat treatment furnace to bond the heat sink fin elements 12 together with a given distance provided between any two adjacent heat sink fin elements to produce a multilayered body 14 that constitutes a heat sink as shown in FIG. 8E.

This mode of implementation is also used to produce a multilayered body 14 or a heat sink without any particular difficulty.

Figure 9:
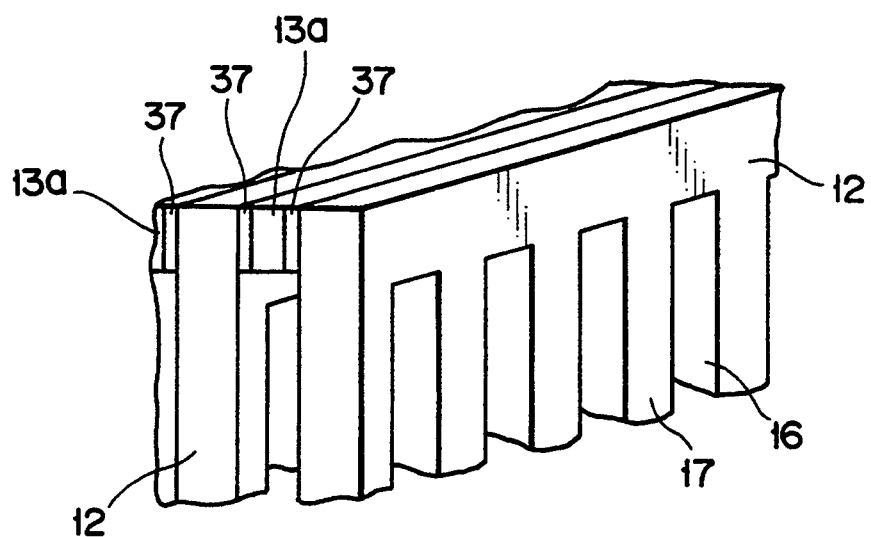
FIG. 9 is a perspective partial view of a modified multilayered body of the embodiment of FIG. 1.
Figure 10:
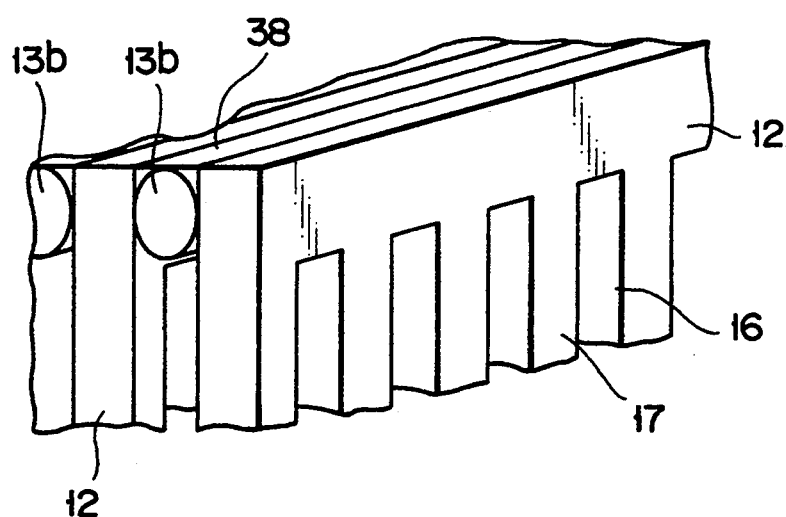
FIG. 10 is a perspective partial view of another modified multilayered body of the embodiment of FIG. 1.

While spacers made of a thermally conductive material or solder ribbons are used in the above described modes of implementation, ribbon-shaped spacers 13a carrying solder layers 37 (or silver layers) on both sides and shown in FIG. 9 may alternatively be used. Such a spacer 13 can provide a secure bonding effect and an accurately sized gap between two adjacent heat sink fin elements 12 because solder is evenly distributed along the bonding areas of the heat sink fin elements 12.

A spacer does not necessarily show a rectangular cross-sectional view and a spacer 13b having an elliptical cross section or a spacer having a polygonal cross section may be alternatively used. A spacer 13b having an elliptical cross section can provide a large bonding area when related heat sink fin elements are bonded together by solder 38.

Figure 11:
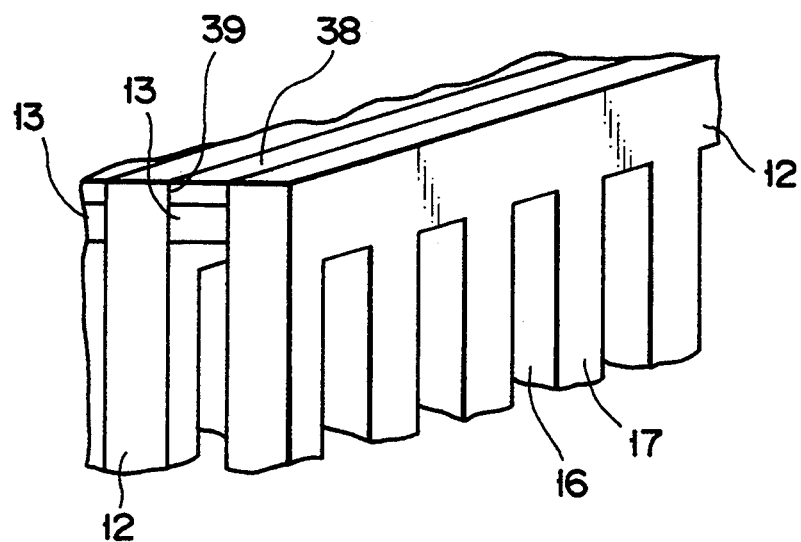
FIG. 11 is a perspective partial view of still another modified multilayered body of the embodiment of FIG. 1.

A modified multilayered body 14 having spacers 13 slightly withdrawn from its outer surface as illustrated in FIG. 11 ensures secure bonding as solder 38 or other bonding agent can be applied to it to fill the recesses 39 formed by the withdrawn spacers 13.

Figure 12:
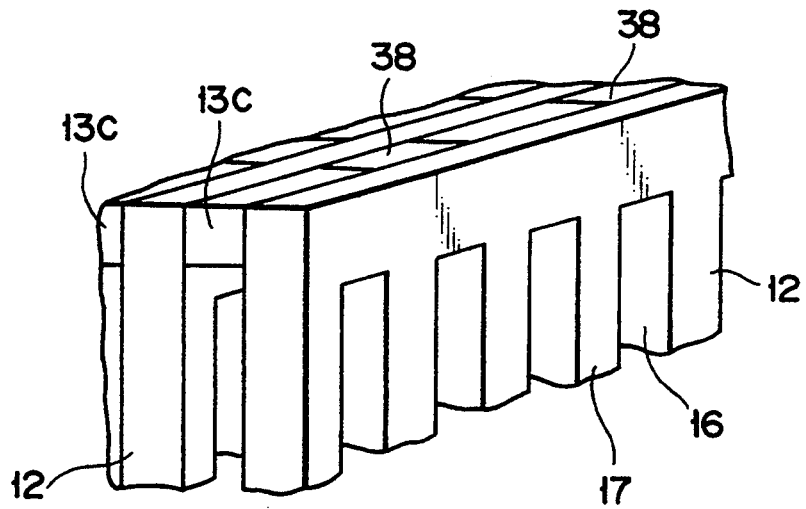
FIG. 12 is a perspective partial view of still another modified multilayered body of the embodiment of FIG. 1.

FIGS. 12 and 13 show two other modified multilayered bodies 14 where spacers 13c are provided with outside recesses 40 that can be filled with solder 38 or other bonding agent for secure bonding.

Figure 15:
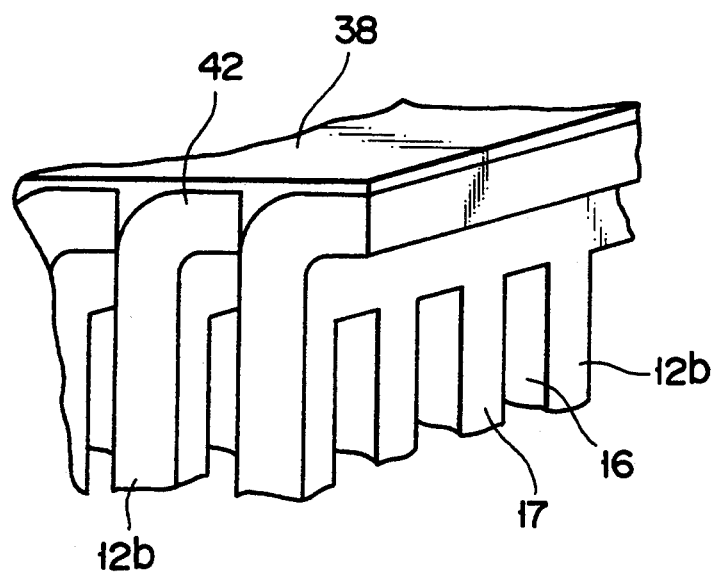
FIG. 15 is a perspective partial view of still another modified multilayered body of the embodiment of FIG. 1.

While the above described multilayered bodies comprise spacers which are prepared separately, spacers may be alternatively produced by simply bending lateral edges of heat sink fin elements 12b by 180° as illustrated in FIG. 14 or by 90° as illustrated in FIG. 15 at the time of manufacturing heat sink fin elements. In this way, the number of processing steps in heat sink manufacturing can be reduced by using the folded sections 41 and 42 as so many spacers.

Figure 16:
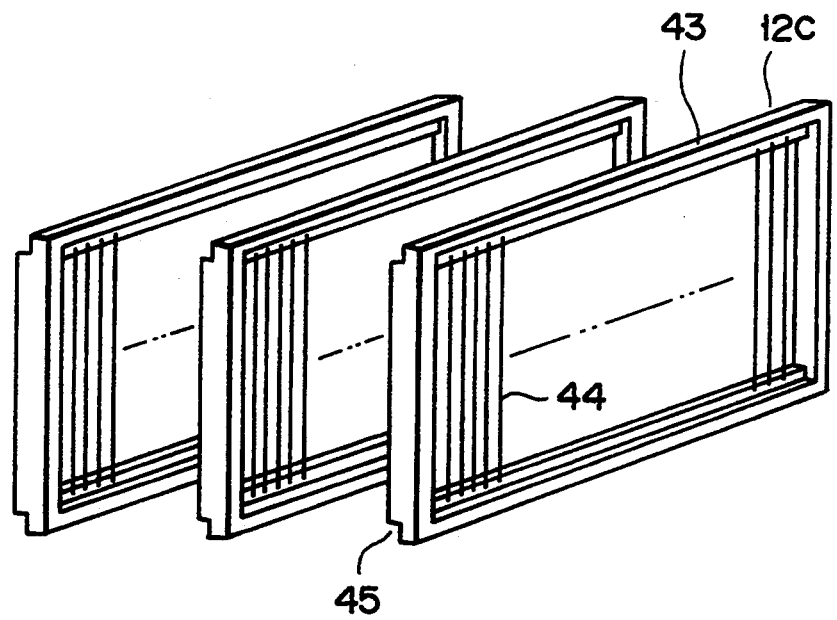
FIG. 16 is an exploded perspective view of modified heat sink fin elements of the embodiment of FIG. 1.

While a heat sink fin element is prepared by cutting slits through a thin plate in the above description, a heat sink fin element 12c to be used for the purpose of the present invention may alternatively be prepared by arranging a number of fine metal wires 44 in parallel between a pair of opposite lateral edges of a frame 43 of a thermally conductive material by means of a "wire bonding" technique as illustrated in FIG. 16. Here, the fine metal wires 44 constitute pin-fin sections. It may be convenient to form cut-off areas 45 along lateral edges of a frame 43 and fill those cut-off areas 45 with solder to bond it with neighboring heat sink fin elements 12c.

The frame 43 may be replaced by a pair of rod-shaped members. In this case, a heat sink fin element can be prepared by securely holding the rod-shaped members and arranging a number of fine metal wires 44 in parallel between them. It may be easily understood that a plurality of fine metal wires 44 can be replaced by a single but long metal wire which is laid between the pair of rod-shaped members in a reciprocating manner to form a pattern of parallel lines.

Figure 17:
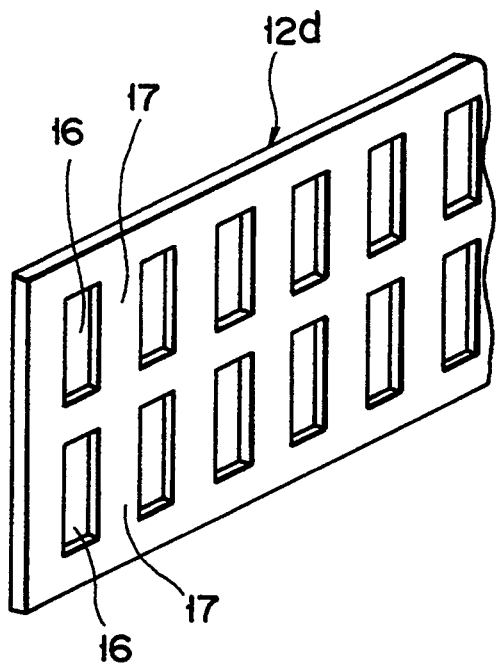
FIG. 17 is an exploded perspective view of another modified heat sink fin elements of the embodiment of FIG. 1.

While a single row of a number of slits are cut through a rectangular thin plate of a thermally conductive material in parallel with the shorter edges and pin-fin sections are formed by the remaining area of the plate to prepare a heat sink fin element in the above description, a heat sink fin element 12d having two or more than two rows of slits 16 may alternatively be formed as shown in FIG. 17. Still alternatively, a heat sink fin element 12 having a row of slits rotated by 90° relative to those of the adjacent heat sink fin elements may be used to form a three dimensional matrix of pin-fins. Similarly, slits 16 may be angularly displaced to a certain extent for each thin plate 15 so that a multilayered body 14 comprising heat sink fin elements provided with pin-fin sections 17 arranged in different directions can be obtained.

Figure 18:
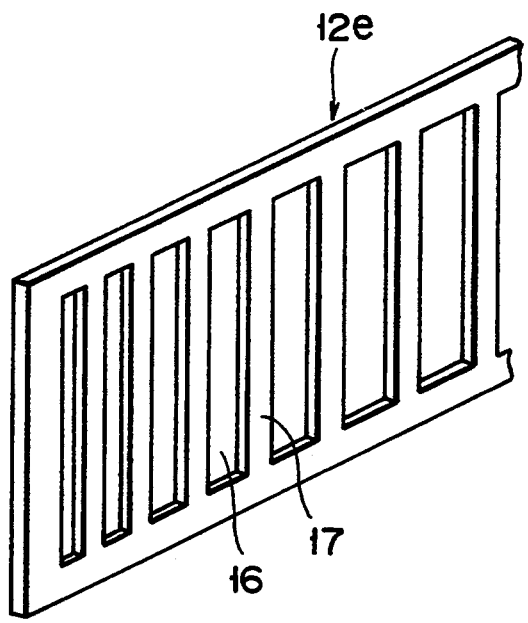
FIG. 18 is an exploded perspective view of still another modified heat sink fin elements of the embodiment of FIG. 1.

FIG. 18 shows a heat sink fin element 12e having unevenly distributed pin-fin sections 17 along its longer edges.

FIG. 19 shows a heat sink fin element 12f provided with pin fin sections 17 having different widths along its longer edges.

FIG. 20 shows a heat sink fin element 12g provided with pin-fin sections 17a, each of which has a width that varies along its shorter edges.

FIG. 21 shows a heat sink fin element 12h provided with pin-fin sections 17b having cyclically or randomly undulated lateral edges.

While FIGS. 18 through 20 show heat sink fin elements provided with slits 16 of different widths to achieve an enhanced heat transfer efficiency, which can vary depending on the nature of their applications, the objective of effective heat transfer may be also achieved by varying the thickness of spacers 13 or thin plates 15 to be used for the purpose of the present invention. A heat sink fin element provided with pin-fin sections having undulated lateral edges as illustrated in FIG. 21 may be obtained by repeatedly conducting an etching process. Similarly, cylindrical pin-fin sections may be produced by etching the edges of rectangular pin-fin sections. Cylindrical pin-fin sections having flat sections may be prepared in a similar manner.

When bonding a number of heat sink fin elements together with spacers to produce a multilayered body 14, a number of different arrangements of the heat sink fin elements may be conceivable. FIG. 22A shows a staggered arrangement of heat sink fin elements 12 devised, by referring to the pin-fin sections 17 of the immediately upstream heat sink fin element 12 relative to the direction of flowing fluid as indicated by arrow 46, not to completely shadow the pin-fin sections 17 of the downstream heat sink fin element 12. Here, the pin-fin sections 17 of neighboring heat sink fin elements 12 are laterally displaced exactly by a half pitch of the array of pin-fin sections. FIG. 22B shows a different arrangement of heat sink fin elements 12, where the pin-fin sections 17 of downstream heat sink fin elements 12 are displaced stepwise in a lateral direction. With any of these arrangements, fluid coolant collides with the pin-fin sections 17 to enhance its cooling effect (and therefore the heat transfer efficiency of the radiator). It may be needless to say that a similar effect may be obtained by employing an three-dimensional matrix arrangement of pin-fin sections 17 described above in connection with FIG. 17.

Figure 1A:
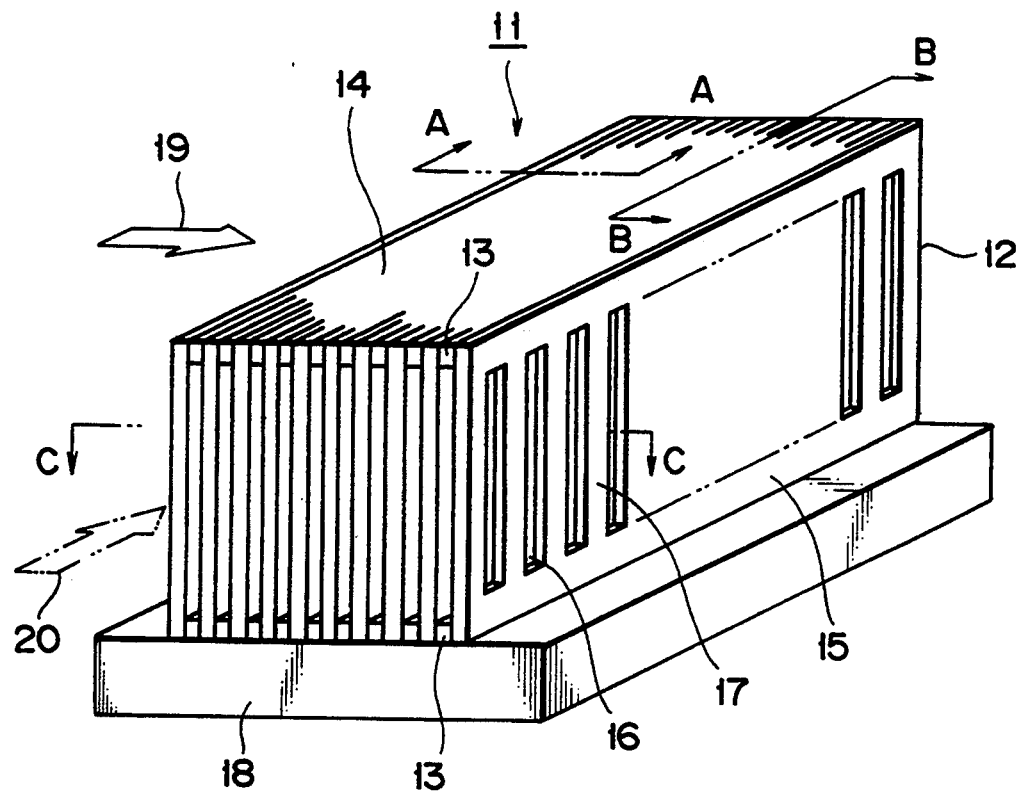
FIG. 1A is a schematic perspective view of an embodiment of the heat sink of the invention.
Figure 1B:
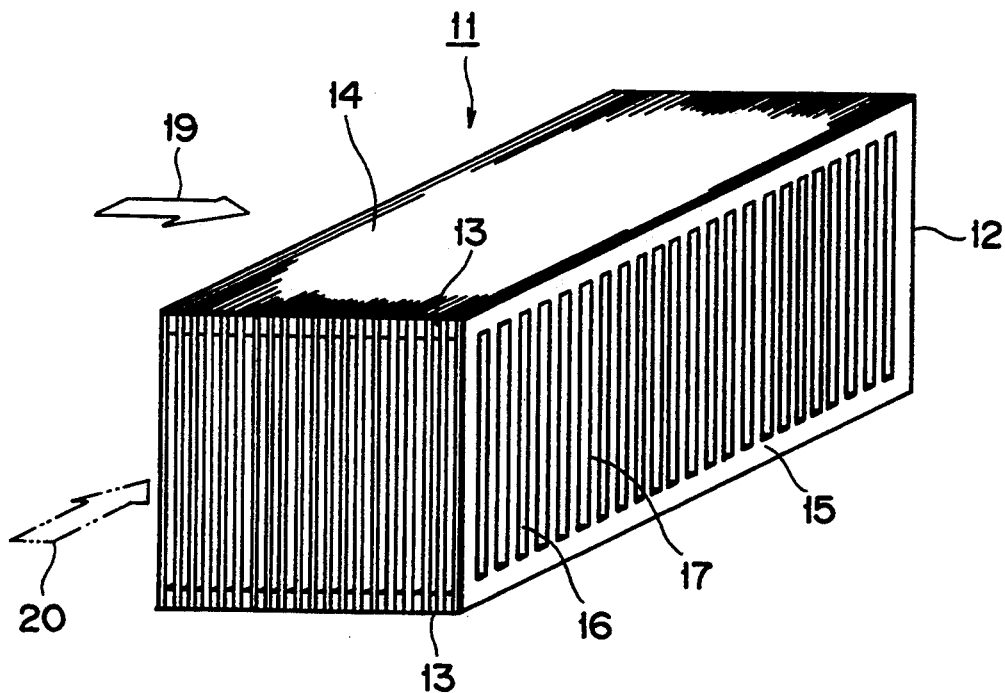
FIG. 1B is an artistic view of the embodiment of FIG. 1A.
Figure 23:
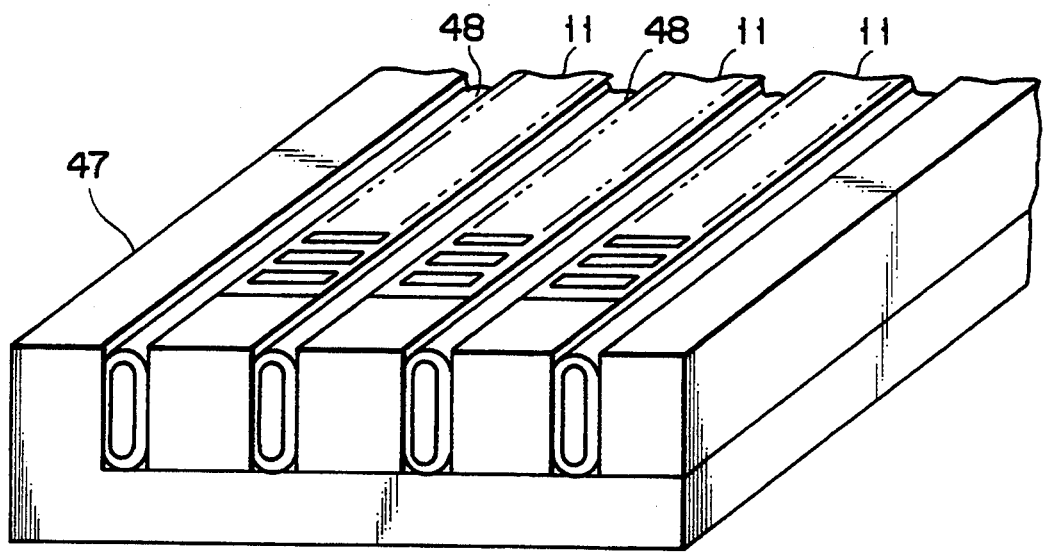
FIG. 23 is a perspective view of a heat exchanger of an air conditioner comprising heat sinks according to the invention.
Figure 24:
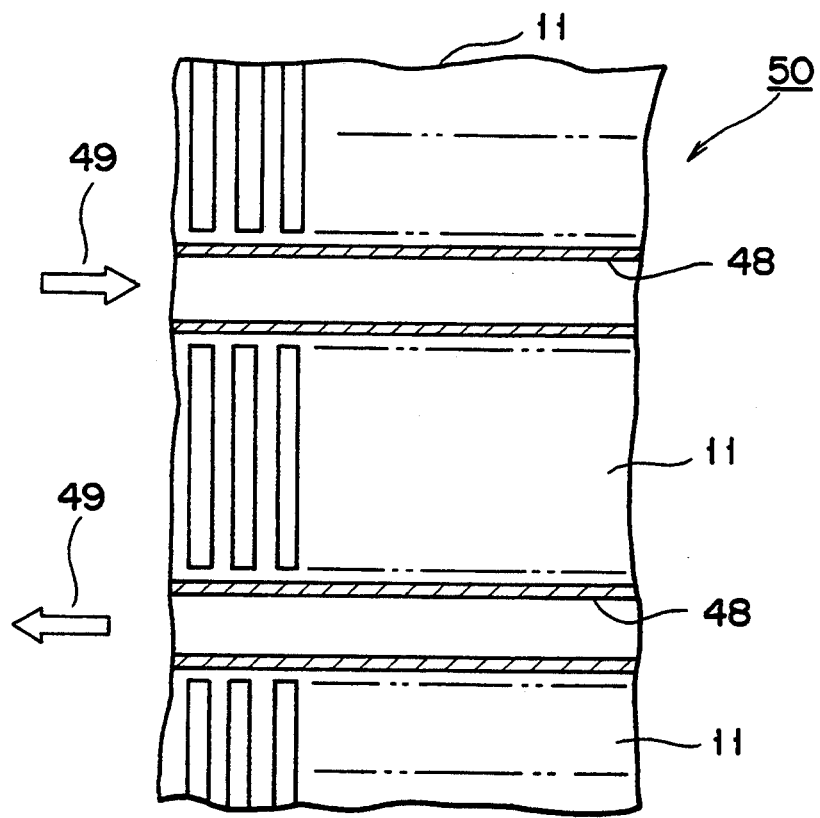
FIG. 24 is a sectional view of the heat exchanger of FIG. 23.

FIG. 23 shows an application of heat sinks 11 as illustrated in FIG. 1A, where they are used for a heat exchanger of an air conditioning system. Here, heat sinks 11 and pipes 48 are alternately arranged within a bonding Jig 47 and neighboring components are bonded together by solder or other bonding agent. After completion of the bonding operation, a heat exchanger 50 of an air conditioning system comprising a number of pipes 48 for providing fluid (coolant) paths and heat sinks 11 arranged in a multilayer configuration as shown in FIG. 24 is obtained by simply removing the jig 47.

FIG. 25 shows a radiating apparatus 53 comprising a duct and a number of heat sinks as shown in FIG. 1A and designed to be used for cooling integrated circuit packages 52.

Referring to FIG. 25, the side wall of the duct 51 is partly constituted by a large circuit substrate (supporting plate) 54 carrying on it a number of integrated circuit packages 52. The heat sinks 11 are arranged within the duct in such a manner that they are thermally in contact with the respective integrated circuit packages 52 which are so many heat sources and allow a flow of fluid coolant along the duct 51 without 10 any significant obstruction.

Since the heat sinks 11 of a heat exchanger having such a configuration are constantly exposed to a flow of fluid coolant, the integrated circuit packages 52 can be effectively and efficiently cooled by installing heat sinks having a large number of pin-fin sections.

While only a side of the heat sinks 11 is kept in contact with the integrated circuit packages 52 in the above arrangement, each heat sink 11 may be arranged thermally in contact with two different integrated circuit packages 52 at opposite lateral sides as shown in FIG. 26. While a circuit substrate is used to form part of the side wall of a duct in the above described application, a completely separate duct may be installed, arranging the integrated circuit packages 52 outside and the heat sinks 11 inside of the duct.

While the multilayered body 14 of a heat sink 11 is realized in the form of a rectangular block in the above description, a multilayered body 14 to be used for the purpose of the present invention may alternatively have a profile as shown in FIG. 27, where the height of the multilayered body 14a is gradually reduced along the flowing direction of fluid coolant 56. With such an arrangement, the flow rate of fluid coolant 56 running through the multilayered body 14a will be accelerated as the fluid approaches the rear end of the multilayered body 14a so that the multilayered body may show an evenly distributed heat radiation effect along its length.

While the multilayered body of a heat sink 11 has a flat or inclined outer surface in the above description, a multilayered body 14b to be used for the purpose of the invention may alternatively have a jagged outer surface 57, the thermally conductive plate 58 carrying it being provided with a correspondingly jagged surface 59 as shown in FIG. 28, so that the multilayered body 14b can be easily aligned for assembly by simply bringing the corresponding surfaces 57, 59 into engagement.

Figure 29:
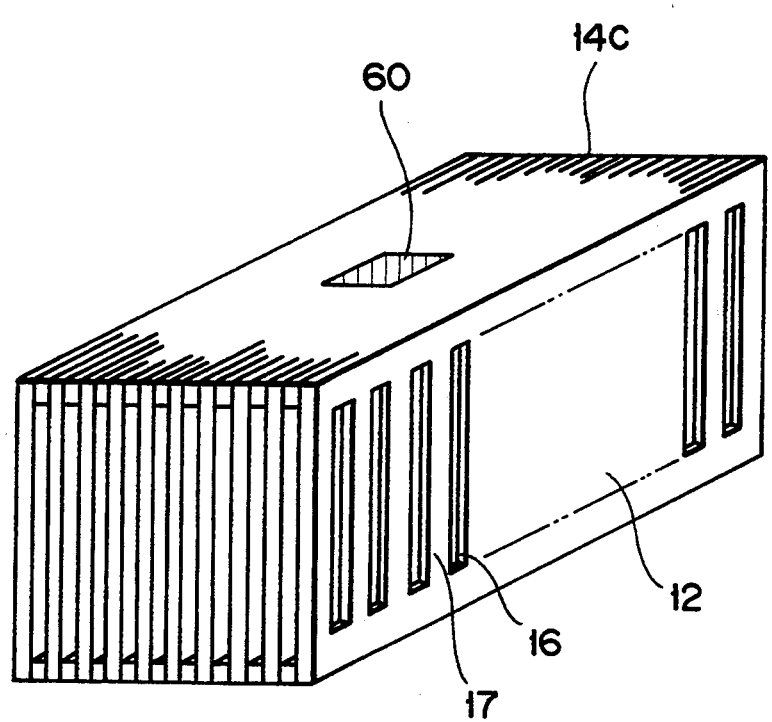
FIG. 29 is a perspective view of still another modified multilayered body of the embodiment of FIG. 1.

FIG. 29 shows a multilayered body 14c provided at its center with a hole 60 where a bolt is inserted when it is fitted to a thermally conductive plate. A hole 60 as shown in FIG. 29 may be formed by cutting a certain number of thin plates 15 and spacers 13 into two halves and appropriately reducing their longitudinal length so that the hole 60 is necessarily produced when all the component plates 15 and spacers 13 are assembled and bonded together. The hole 60 is used to receive a bolt that securely anchors the multilayered body 14c to a thermally conductive plate, although a multilayered body may be fitted to a thermally conductive plate by different means such as silver brazing or application of an adhesive agent (epoxy resin). A plate provided with a threaded hole may be laid on a multilayered body having a hole 60 and the multilayered body may be anchored to a thermally conductive plate by means of a screw. A plate provided with a screw may alternatively be used for anchoring a multilayered body to a thermally conductive plate.

While a spacer is prepared separately or by folding part of a heat sink fin element 12 and is arranged between two adjacent heat sink fin elements in the above description, the use of such spacers becomes unnecessary for a multilayered body if a supporting body 62 of a thermally conductive material illustrated in FIG. 30 and provided with a number of paired grooves 61a, 61b for receiving lateral edges of heat sink fin elements 12. Then, a multilayered body 14b can be produced by bonding the heat sink fin elements 12 to the supporting body 62 with a boding agent.

A supporting body 64 shown in FIGS. 31 and 32 is provided with one or more than one U-shaped grooves 63, in which a number of heat sink fin elements 12i each having a pair of lateral edges 65 that are bent by 90° and serve as spacers are laid as so many layers. Then, a multilayered body 14e is produced by bonding the bent lateral edges 65 to the supporting body 64 with a bonding agent. The bent lateral edges 65 may not necessarily be formed in advance if heat sink fin elements having a width greater than that of the grooves 63 are pushed into the groove so that the lateral edges of the heat sink fin elements are forcibly bent to act as spacers.

Figure 33:
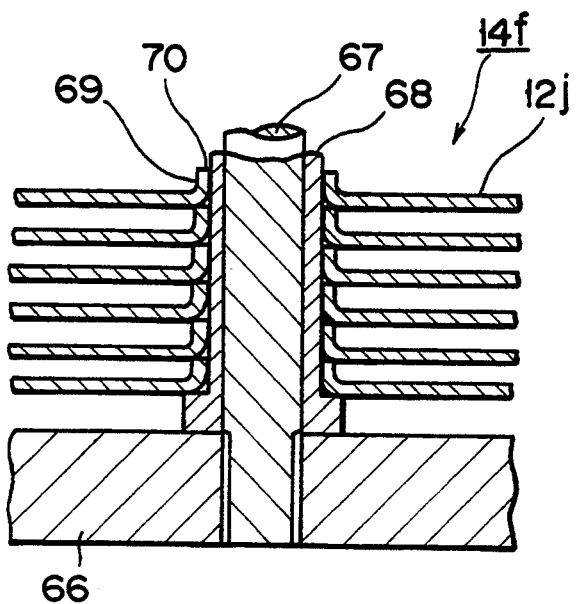
FIG. 33 is a partial sectional view of another embodiment of the heat sink of the invention, showing the area where heat sink fin elements are anchored.

FIG. 33 shows the use of a thermally conductive rods 67 standing upward from a thermally conductive plate 66 and carrying a sleeve 68 around it. On the other hand, each heat sink fin element 12j has a holed boss 70 equipped with a flange 69 that serves as a spacer. A number of heat sink fin elements 12j are aligned and stacked around the thermally conductive rod 67 as they are fallen from above and received by the rod 67 that goes through the holed bosses 70. Then, a multilayered body 14f will be produced by bonding the thermally conductive rod 67, the sleeve 68 and the flanges 69 together with a bonding agent. Alternatively, a multilayered body and a thermally conductive plate may be so arranged that they are brought to a tight engagement without using a thermally conductive rod. Still alternatively, a number of thermally conductive plates may be arranged in parallel around a thermally conductive rod with a given distance provided between any two adjacent plates and then multilayered bodies may be rigidly fitted onto the thermally conductive plates. Such an arrangement may be comparable to a multi-disc fin of a known type additionally comprising heat sinks of the present arranged among the discs and therefore offers a huge surface area for heat transfer.

Figure 34:
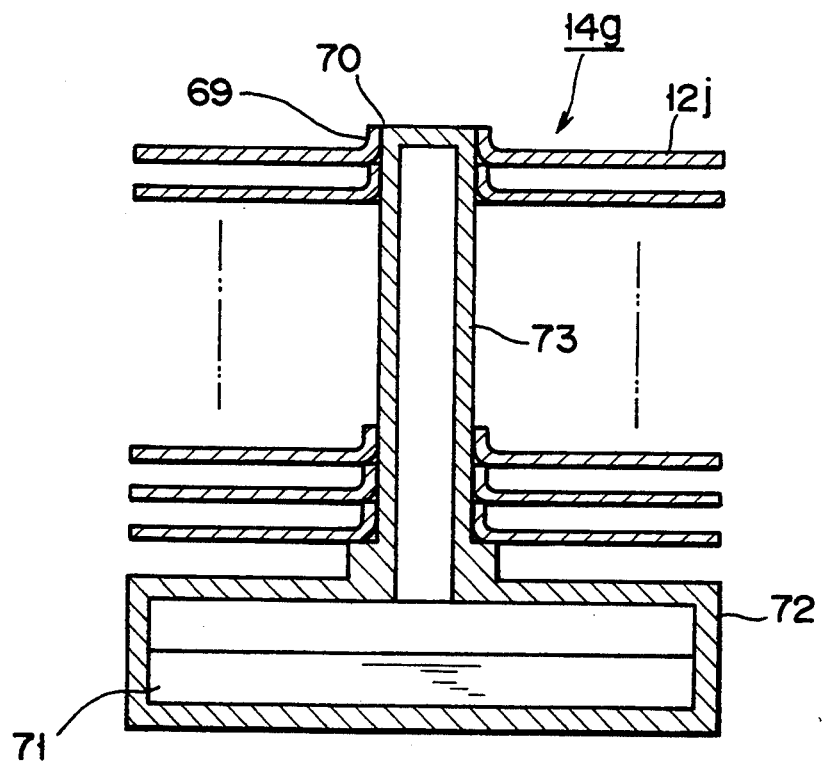
FIG. 34 is a sectional view of still another embodiment of the heat sink of the invention.

FIG. 34 shows a combination of a multilayered body 14g and a heat pipe 72, where holed bosses 70 of heat sink fin elements 12j are brought to engagement with and bonded to the outer periphery of a heat sink column 73 of a heat pipe 72 that contains an active fluid material 71 and is hermetically sealed.

Figure 35:
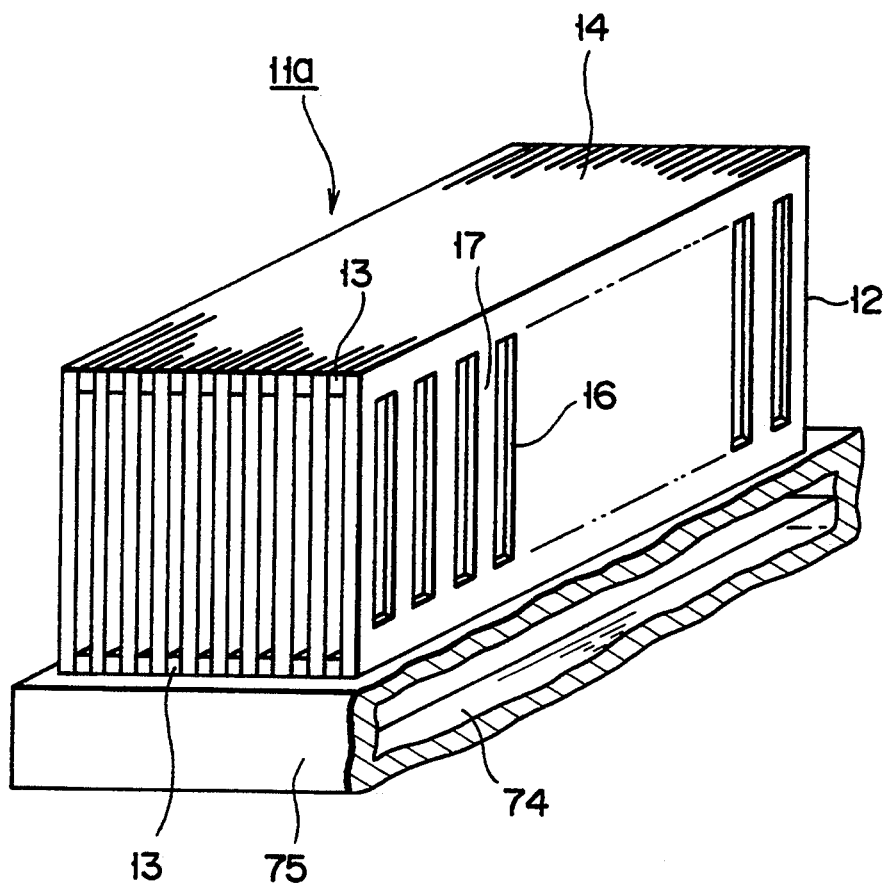
FIG. 35 is a partially broken perspective view of still another embodiment of the heat sink of the invention.

FIG. 35 shows an arrangement of a heat sink 11a, where a multilayered body 14 having a configuration as shown in FIG. 1A is bonded to a heat pipe 75 that airtightly contains an active fluid material 74.

FIG. 36 shows a heat sink 11b comprising a multilayered body 14h which is integral with a heat pipe 77 that airtightly contains an active fluid material 76.

Figure 37:
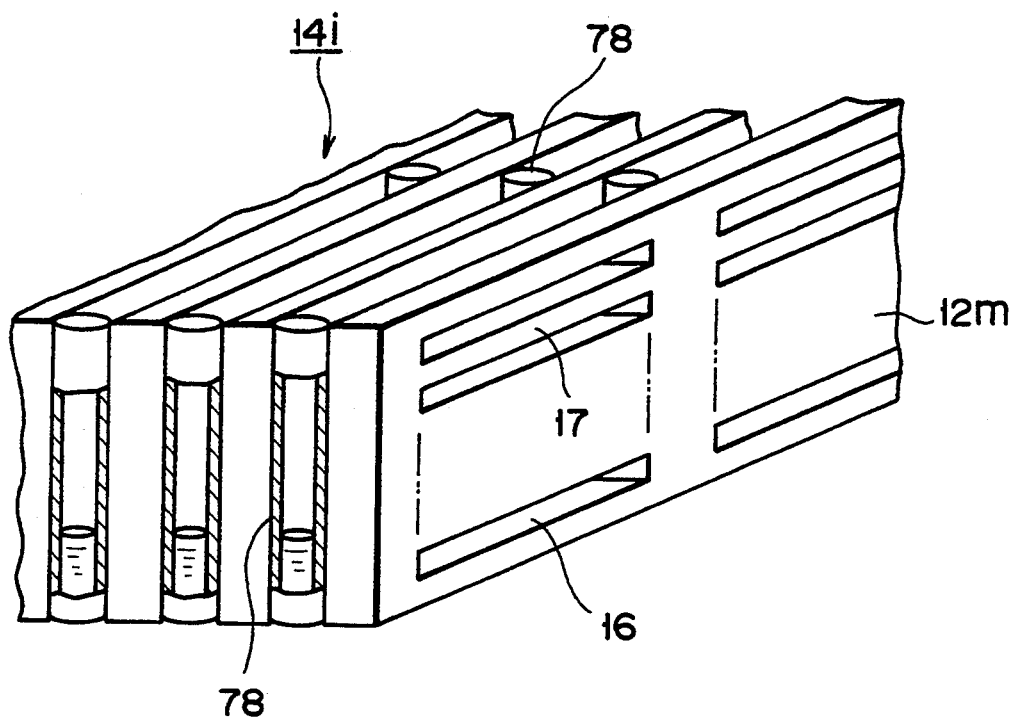
FIG. 37 is a partially broken perspective view of still another modified multilayered body to be used for the purpose of the present invention.
Figure 38:
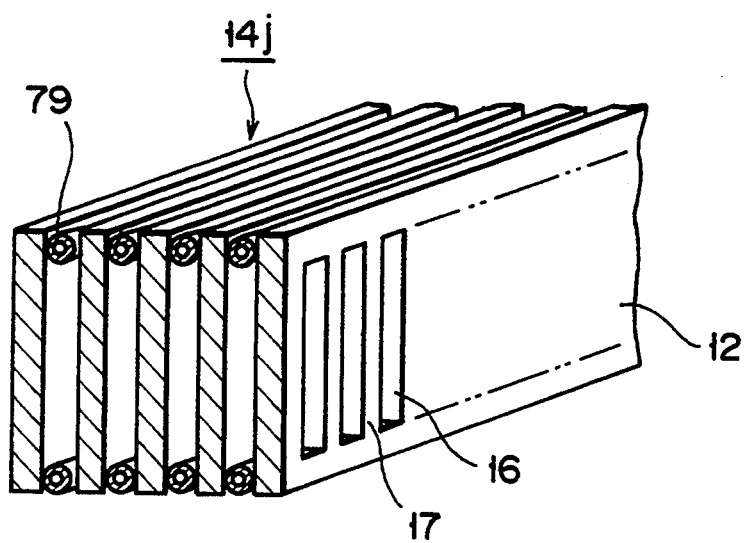
FIG. 38 is a partially broken perspective view of still another modified multilayered body to be used for the purpose of the present invention.

FIG. 37 shows a multilayered body 14i realized by using different sections of a heat pipe 78 as so many spacers that separate adjacent heat sink fin elements 12m. A multilayered body 14j as illustrated in FIG. 38 is realized by replacing the heat pipe of FIG. 37 with a coolant guide pipe 79.

Figure 39:
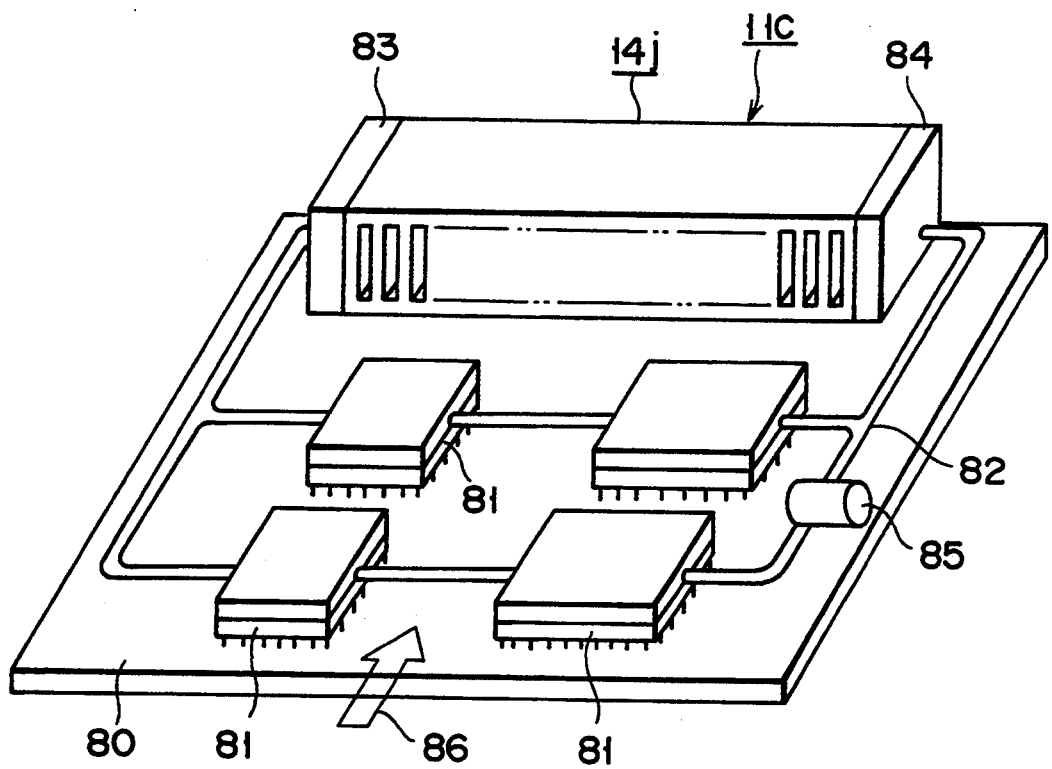
FIG. 39 is a perspective view of an arrangement of heat sinks comprising multilayered bodies as illustrated in FIG. 38 in an actual application.

FIG. 39 shows how a heat sink 11 comprising a multi-layered body 14j having a configuration as described above can be used to cool integrated circuit packages 81 mounted on a substrate 80. Here, a branched conduit 82 for conducting fluid coolant is arranged in contact with the integrated circuit packages 81 and the two ends of the conduit 82 are connected to the coolant guide pipe 79 of the multilayered body 14j by way of manifolds 83, 84 to set up an endless path for the coolant which is forced to circulate along the endless path by a pump 85. A ventilator (not shown) is used to blow air through the multilayered body 14j in the direction as indication by large arrow 86 to carry away any heat stored on the substrate 80. It may be needless to say that the coolant passes through the coolant guide pipe 79 having sections which are used as spacers.

Figure 40:
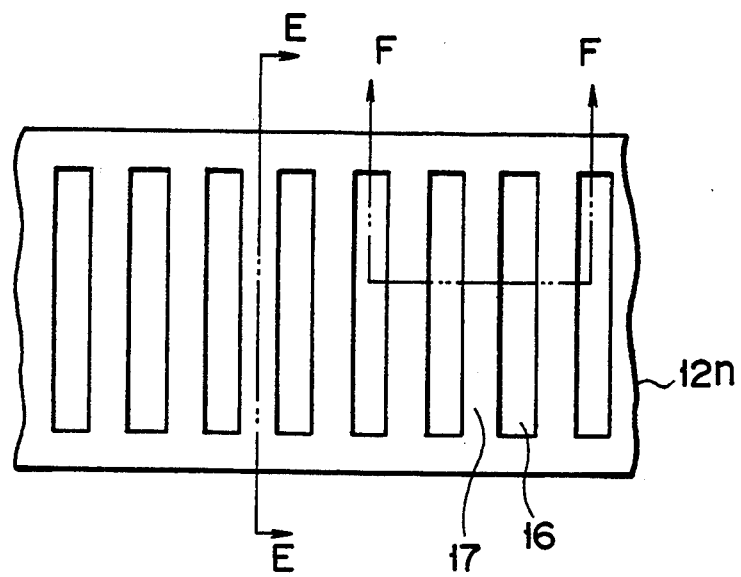
FIG. 40 is a partial side view of a modified heat sink fin element to be used for the purpose of the present invention.
Figures 41A, 41B:
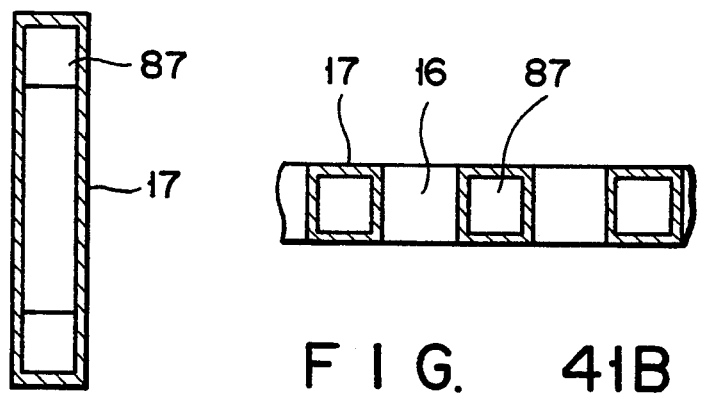
FIG. 41A is a sectional view of the heat sink fin element of FIG. 40 cut along E—E line.
FIG. 41B is a sectional view of the heat sink fin element of FIG. 40 along F—F line.

FIGS. 40, 41A and 41B show a heat sink fin element 12a through which coolant paths 87 are arranged to allow fluid coolant to pass therethrough. The coolant guide pipe of a multilayered body 14j as shown in FIG. 38 may be alternatively arranged on and under the multilayered body, using independent spacers to secure a given distance between adjacent heat sink fin elements. With such an arrangement, a pipe having a large cross section may be used to raise the coolant flow rate.

Figure 42A:
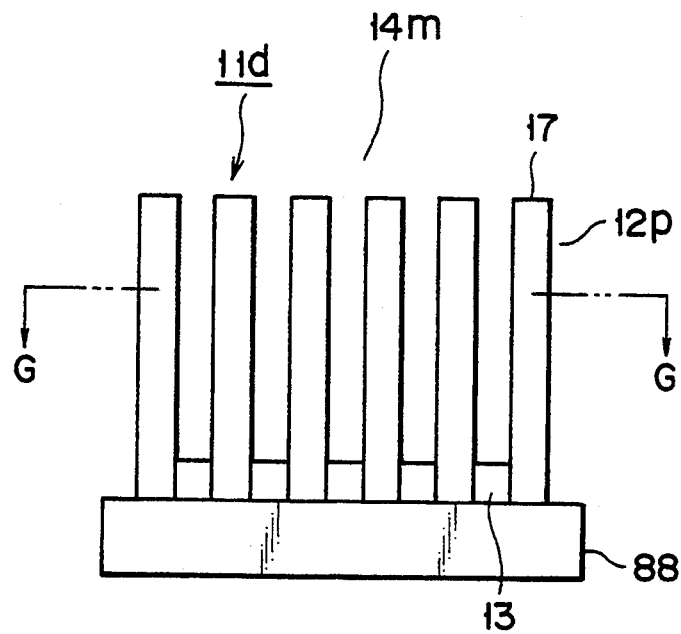
FIG. 42A is a plan view of still another embodiment of the heat sink of the invention.
Figure 42B:
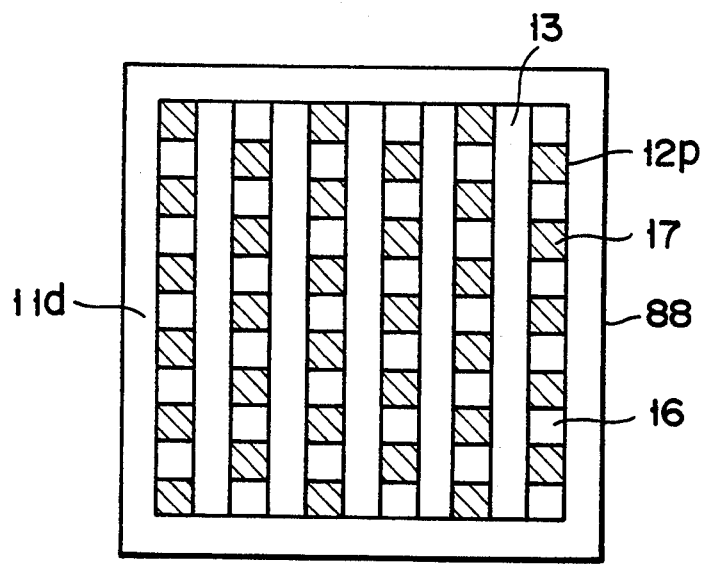
FIG. 42B is a sectional view of the embodiment of FIG. 42A cut along G—G line.

FIGS. 42A and 42B show a heat sink 11d comprising a multilayered body 14m which is devoid of a top plate. This jagged formation of a multilayered body 14m that looks like a pin pad studded with standing pins allows a cooling medium to be blown onto its jagged surface for effective cooling. Reference numeral 88 in these illustrations denotes a heat source or a thermally conductive plate. Such a multilayered body may be prepared by cutting off the top plate of a multilayered body 14 as shown in FIG. 1A or by using heat sink fin elements 12 that have a shape as shown in FIG. 3 but do not have a lateral marginal area (so that slits extend to a lateral extremity) with spacers arranged only along the remaining lateral edges of the heat sink fin elements 12.

A heat sink according to the invention may be modified in many different ways without departing from the scope of the invention.

Moreover, the underlying structural concept of a heat sink according to the invention may be applied to devices other than heat sinks. For instance, a structure realized on the basis of a heat sink according to the invention and having pin-fin sections made of a catalytic material such as platinum can be used as an effective catalyst. Such a structure may also be used as a catalyst carrier when the pin-fin sections are coated with a catalytic material. A structure as described above may also be used as a fluid filter or a electric wave filter. A fluid filter having such a configuration may be particularly advantageous if the components of the multilayered body are not bonded but held together by a jig so that it may be easily disassembled for cleaning.

As may be apparent from the above description for various embodiments of the invention and modifications to be made thereto, the present invention provides a method of producing a variety of heat sinks at low cost by employing a simple manufacturing process.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A heat sink comprising:
a plurality of heat sink elements each including a thin thermally conductive plate, each of said plurality of heat sink elements having a plurality of openings arranged in one direction to thereby form an array of fins, and said plurality of openings constituting a first group of openings through which a coolant is allowed to flow;

separating means for separating adjacent heat sink elements by a predetermined distance in order to separate adjacent arrays of fins formed in each of said heat sink elements, said separating means extending in said one direction and being arranged along lateral edges of said plurality of heat sink elements, predetermined distances between said plurality of heat sink elements separated by said separating means constituting a second group of openings through which the coolant is allowed to flow from a direction other than through said first group of openings; and a connecting region formed of said lateral edges of said plurality of heat sink elements and said separating means, said connecting region being thermally connected to an electric component;

whereby said electric component generates heat therefrom, and transfers the heat to said array of fins through said connecting region and then to the coolant flowing through at least one of said first and second groups of openings.

2. The heat sink according to claim 1, wherein said plurality of openings are formed like slits.

3. The heat sink according to claim 1, wherein said plurality of openings extend in a direction perpendicular to said one direction.

4. The heat sink according to claim 1, wherein said fins include pin-shaped or needle-shaped thin fins.

5. The heat sink according to claim 1, wherein said separating means includes a thermally conductive spacer interposed between adjacent heat sink elements.

6. The heat sink according to claim 1, wherein said separating means includes a bent portion formed by bending at least a portion of each of said lateral edges of said plurality of heat sink elements at a predetermined angle.

7. The heat sink according to claim 1, wherein said separating means includes at least one projection formed at the portion of each of said lateral edges of said plurality of heat sink elements.

8. The heat sink according to claim 1, wherein said connecting region is directly connected to said electric component.

9. The heat sink according to claim 1, wherein said connecting region is connected to said electric component with a thermally conductive member interposed therebetween.

10. A heat sink comprising:
a plurality of heat sink elements each including a thin thermally conductive rectangular plate, each of said plurality of heat sink elements having a plurality of openings arranged along a pair of opposing lateral edges of heat sink elements to thereby form an array of fins, and said plurality of openings constituting a first group of openings through which a coolant is allowed to flow;

separating means for separating adjacent heat sink elements by a predetermined distance in order to separate adjacent arrays of fins formed in each of said heat sink elements, said separating means being arranged along said pair of lateral edges of heat sink elements; and wherein predetermined distances between said plurality of heat sink elements separated by said separating means constitute a second group of openings through which the coolant is allowed to flow.

11. The heat sink according to claim 10, wherein said plurality of openings are formed like slits.

12. The heat sink according to claim 10, wherein said plurality of openings are arranged in a direction perpendicular to said pair of opposing lateral edges of heat sink elements.

13. The heat sink according to claim 10, wherein said fins include pin-shaped or needle-shaped thin fins.

14. The neat sink according to claim 10, wherein said separating means includes a thermally conductive spacer interposed between adjacent heat sink elements.

15. The heat sink according to claim 10, wherein said separating means includes a bent portion formed by bending at least a portion of each of said lateral edges of said plurality of heat sink elements at a predetermined angle.

16. The heat sink according to claim 10, wherein said separating means includes at least one projection formed at the portion of each of said lateral edges of said plurality of heat sink elements.

17. A heat sink comprising:

a plurality of heat sink elements each including a thin thermally conductive plate, each of said plurality of heat sink elements having a plurality of openings arranged in one direction to thereby form an array of fins, said plurality of fins constituting a first group of openings through which a coolant is allowed to flow;

separating means for separating adjacent heat sink elements by a predetermined distance in order to separate adjacent arrays of fins formed in each of said heat sink elements, said separating means extending in said one direction and being arranged along lateral edges of said plurality of heat sink elements, predetermined distances between said plurality of heat sink elements separated by said separating means constituting a second group of openings through which the coolant is allowed to flow from a direction other than through said first group of openings;

a connecting region formed of said lateral edges of said plurality of heat sink elements and said separating means; and a thermally conductive plate thermally connected to said connecting region, said thermally conductive plate having a contact surface capable of contacting all of said connecting region, and being thermally connected to an electric component;

whereby said electric component generates heat and transfers the heat to said array of fins through said connecting region and said thermally conductive plate, and then to the coolant flowing through at least one of said first and second groups of openings.

18. The heat sink according to claim 17, wherein said plurality of openings are formed like slits.

19. The heat sink according to claim 17, wherein said plurality of openings extend in a direction perpendicular to said one direction.

20. The heat sink according to claim 17, wherein said fins include pin-shaped or needle-shaped thin fins.

21. The heat sink according to claim 17, wherein said separating means includes a thermally conductive spacer interposed between adjacent heat sink elements.

22. The heat sink according to claim 17, wherein said separating means includes a bent portion formed by bending at least a portion of each of said lateral edges of said plurality of heat sink elements at a predetermined angle.

23. The heat sink according to claim 17, wherein said separating means includes at least one projection formed at the portion of each of said lateral edges of said plurality of heat sink elements.

* * * * *